United States Patent
Mukai et al.

(10) Patent No.: US 8,233,571 B2
(45) Date of Patent: Jul. 31, 2012

(54) RECEPTION DEVICE AND RECEPTION METHOD

(75) Inventors: Hirohito Mukai, Kanagawa (JP); Yutaka Murakami, Osaka (JP); Kiyotaka Kobayashi, Tokyo (JP); Hidekuni Yomo, Tokyo (JP); Yoshinori Kunieda, Tokyo (JP)

(73) Assignee: Panasonic Corporation, Osaka (JP)

( * ) Notice: Subject to any disclaimer, the term of this patent is extended or adjusted under 35 U.S.C. 154(b) by 472 days.

(21) Appl. No.: 12/527,654

(22) PCT Filed: Feb. 20, 2008

(86) PCT No.: PCT/JP2008/000280
§ 371 (c)(1),
(2), (4) Date: Aug. 18, 2009

(87) PCT Pub. No.: WO2008/105147
PCT Pub. Date: Sep. 4, 2008

(65) Prior Publication Data
US 2010/0091910 A1    Apr. 15, 2010

(30) Foreign Application Priority Data

Feb. 20, 2007   (JP) ................................ 2007-039391

(51) Int. Cl.
*H03D 1/00*        (2006.01)
(52) U.S. Cl. ........ 375/340; 375/147; 375/346; 375/222; 375/341; 370/342; 370/286
(58) Field of Classification Search ............. 375/340, 375/147, 341, 260; 370/342, 286
See application file for complete search history.

(56) References Cited

U.S. PATENT DOCUMENTS

| | | | |
|---|---|---|---|
| 7,209,510 B2* | 4/2007 | Yang et al. | 375/147 |
| 7,643,585 B2* | 1/2010 | Sawada | 375/341 |
| 2001/0014962 A1 | 8/2001 | Obuchi | |
| 2006/0142041 A1* | 6/2006 | Tomasin et al. | 455/522 |
| 2007/0040704 A1* | 2/2007 | Smee et al. | 340/981 |
| 2007/0147329 A1* | 6/2007 | Soriaga et al. | 370/342 |
| 2008/0232497 A1* | 9/2008 | Hart et al. | 375/260 |

FOREIGN PATENT DOCUMENTS

JP   2001-249511   9/2001

(Continued)

OTHER PUBLICATIONS

International Search Report dated Jun. 3, 2008.

(Continued)

*Primary Examiner* — Eva Puente
(74) *Attorney, Agent, or Firm* — Dickinson Wright PLLC

(57) ABSTRACT

A reception device includes reception antennas and an address generation unit that converts a write-in or read-out order of channel estimation values according to a rearrangement rule. A storage unit writes in or reads out channel estimation values in the converted order, and an address generation unit converts a data sequence write-in or read-out order according to the rearrangement rule. A signal storage unit writes in or reads out data sequences in the converted order, and a replica generation unit generates a replica signal by re-modulating the data sequence according to the channel estimation value. A cancel unit successively generates a stream signal in which a data sequence interference signal is cancelled, by using the channel estimation value, the data sequence, and the replica signal.

8 Claims, 28 Drawing Sheets

FOREIGN PATENT DOCUMENTS

| | | |
|---|---|---|
| JP | 2003-348045 | 12/2003 |
| JP | 2004-096492 | 3/2004 |
| WO | 00/52834 | 9/2000 |

OTHER PUBLICATIONS

K. Shibahara, et al., "Heiretsu Kansho Canceller o Mochiita Ayamari Teisei Fugoka MIMO-OFDM no Tokusei—Performance Evaluation of a Parallel Interference Canceller for FEC-Coded MIMO-OFDM," Technical Report of IEICE, vol. 104, No. 123, RCS2004-81, Jun. 2004, pp. 31-35.

K. Shibahara, et al., "Performance Evaluation of Parallel Interference Canceller for FEC-Coded MIMO-SDM," Proceedings of the 2004 IEICE General Conference, Mar. 2004, pp. 519.

* cited by examiner 2332-9

| INPUT VALUE | OUTPUT VALUE |
|---|---|
| 0 | 0 |
| 1 | 13 |
| 2 | 27 |
| 3 | 39 |
| 4 | 1 |
| 5 | 14 |
| 6 | 28 |
| 7 | 40 |
| 8 | 2 |
| 9 | 15 |
| . | . |
| . | . |
| . | . |
| . | . |
| . | . |

FIG.11

RECEPTION DEVICE AND RECEPTION METHOD

TECHNICAL FIELD

The present invention relates to a receiving apparatus and receiving method for receiving signals transmitted from a plurality of transmitting antennas.

BACKGROUND ART

MIMO (Multiple-Input Multiple-Output) transmission is a method for transmitting data by radio using a plurality of transmitting/receiving antennas. In MIMO transmission, different signals are transmitted from a plurality of transmitting antennas at the same frequency, at the same time, and the receiving side receives spatial-multiplexed signals by demultiplexing the signals through signal processing. One such example of signal demultiplexing scheme is a parallel interference canceller (e.g. Non-Patent Document 1). A parallel interference canceller generates a replica signal first by demultiplexing and demodulating signals and then re-modulating the result. Next, interference signals are canceled from the received signal using the replica signal generated. The signal is then re-demodulated and received data is obtained. Thus, reception performance can be improved by repeating re-modulation and re-demodulation.

Conventionally, as a method of reducing the reception delay of an OFDM (Orthogonal Frequency Division Multiplexing) signal in such circumstances, there is a method of combining into one the data rearrangement processes that are carried out in a plurality of locations in the OFDM receiving apparatus (e.g. Patent Document 1). The data rearrangement processes are carried out through interleaving and deinterleaving. In order to rearrange data in this case, given that data normally needs to be cumulated in units of a certain amount, processing delay is produced.

FIG. 1 shows main reception process delays in a parallel interference canceller using OFDM modulation. In FIG. 1, the vertical axis shows various processes to be sequentially applied to received data, and the horizontal axis shows elapsed time. Furthermore, the rectangles in FIG. 1 denote data output units as results of various processes. Each rectangle in this case expresses data of one OFDM symbol, which is the unit when performing FFT (Fast Fourier Transfer) processing. In FIG. 1, received signal 10-0 is subjected to FFT processing after the FFT processing delay 10-1. Data 10-2 after the FFT processing is outputted. As shown in Patent Document 1, since the FFT processing requires data to be cumulated in units of FFT processing, processing delay 10-1 is generated.

Next, the data subjected to the FFT processing is subjected to deinterleaving processing. Deinterleaving requires data to be cumulated for rearrangement, and therefore deinterleaved data 10-4 is outputted deinterleaving processing delay 10-3 later. The deinterleaved data is then subjected to error correction decoding and error-corrected data 10-6 is outputted after error correction decoding processing delay 10-5.

Next, the parallel interference canceller performs re-modulation processing to cancel an interference signal. In this case, the error-corrected data is interleaved for re-modulation. In the interleaving processing, error-corrected data is received as input and interleaved data 10-8 is outputted after interleaving processing delay 10-7. In this case, since data to be rearranged is stored once as in the case of interleaving processing and deinterleaving processing, processing delay 10-7 is generated. Interference of the interleaved data is canceled through canceller processing and data 10-10 with interference canceled is outputted after canceller processing delay 10-9. The canceled signal is subjected to rearrangement processing through deinterleaving and deinterleaved data 10-12 is outputted after deinterleaving processing delay 10-11. The deinterleaved data is subjected to error correction decoding through error correction decoding and decoded data 10-14 is outputted after error correction decoding processing delay 10-13.

Non-Patent Document 1: Koji Shibahara, et al. "Performance Evaluation of Parallel Interference Canceller for FEC-coded. MIMO-SDM," Proceedings of the 2004 IEICE General Conference, B-5-32, 2004

Patent Document 1: Japanese Patent Application Laid-Open No. 2003-60614

DISCLOSURE OF INVENTION

Problems to be Solved by the Invention

However, the method described in Patent Document 1 requires data to be cumulated in units of a certain amount of rearrangement for rearrangement of a data sequence and requires time for the rearrangement processing. Furthermore, the method described in Patent Document 1 has a problem that, in the case of a single carrier or when interleaving rules differ from one stream to another, it is difficult to reduce a time of rearrangement processing. The present invention has been implemented under such circumstances and it is therefore an object of the present invention to provide a receiving apparatus and a receiving method for reducing a processing delay of a parallel interference canceller.

Means for Solving the Problem

In order to solve the above-described problems, the present invention includes: a plurality of receiving antennas that receive a data sequence; a first conversion section that converts order of writing or reading channel estimation information according to a predetermined rearrangement rule; a first storage section into/from which the channel estimation information is written or read in the converted order; a second conversion section that converts order of writing or reading the data sequence according to the rearrangement rule; a second storage section into/from which the data sequence is written or read in the converted order; a re-modulation section that re-modulates the data sequence and generates re-modulated data based on the channel estimation information; a cancellation section that extracts the channel estimation information of the first storage section and the data sequence of the second storage section in the above-described order and generates a signal stream with an interference signal of the data sequence canceled using the channel estimation information, the data sequence and the re-modulated data; and an error correction decoding section that performs error correction decoding based on the signal stream.

ADVANTAGEOUS EFFECT OF THE INVENTION

According to the present invention, the processing delay in a parallel interference canceller can be reduced.

BRIEF DESCRIPTION OF DRAWINGS

FIG. 11 shows an example of the address conversion table;

BEST MODE FOR CARRYING OUT THE INVENTION

Hereinafter, Embodiment 1 to Embodiment 5 of the present invention will be explained with reference to the accompanying drawings.

(Embodiment 1)

Figure 2:
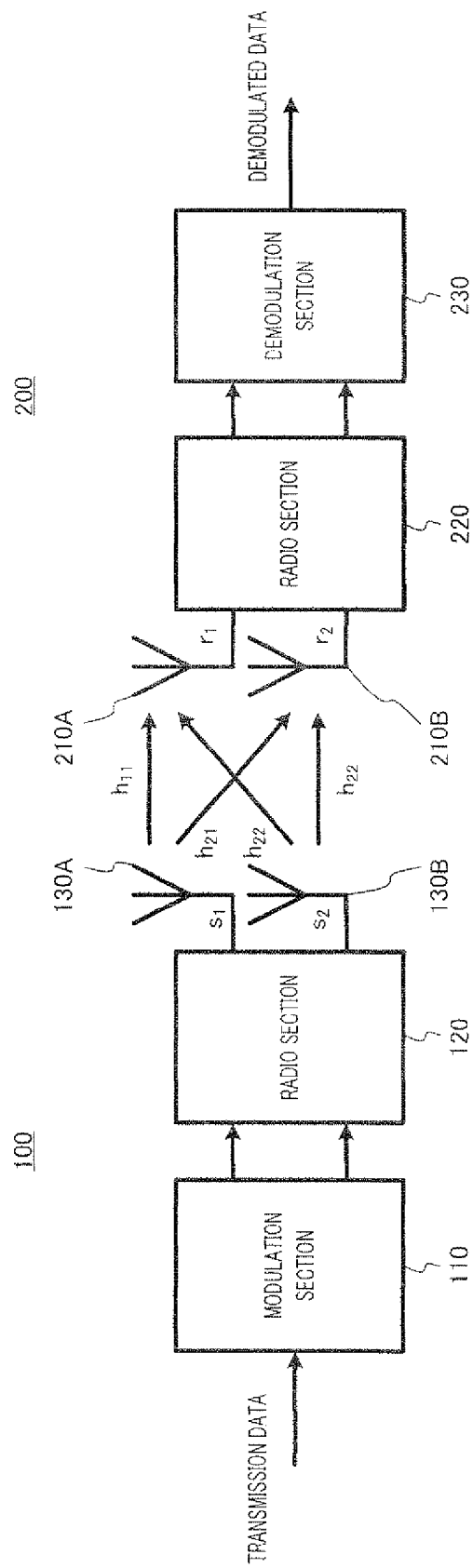
FIG. 2 shows a configuration example of a radio transmission system according to Embodiment 1 of the present invention.

FIG. 2 shows a configuration example of a radio transmission system according to Embodiment 1 of the present invention. The radio transmission scheme in FIG. 2 will be explained, for example, as a MIMO scheme, whereby different pieces of data are transmitted at the same time, at the same frequency, and are multiplexed in space. In FIG. 2, the radio transmission system is configured by including transmitting apparatus 100 and receiving apparatus 200. Transmitting apparatus 100 includes modulation section 110, radio section 120 and two transmitting antennas 130A and 130B. On the other hand, receiving apparatus 200 includes two receiving antennas 210A and 210B, radio section 220 and demodulation section 230.

Modulation section 110 baseband-modulates transmission data. Radio section 120 applies a frequency up-conversion, amplification and so on to the baseband-modulated transmission data, and outputs the transmission data to each transmitting antenna 130A and 130B. Each transmitting antenna 130A and 130B emits the output data of radio section 120 into the air.

Each receiving antenna 210A and 210B receives the data emitted from each transmitting antenna 130A and 130B. Radio section 220 applies a frequency down-conversion, amplification and so on to the data received by each receiving antenna 210A and 210B. Demodulation section 230 then applies baseband demodulation to the output data of radio section 220 and converts the data to demodulated data.

Here, suppose the transmission signal (i.e. transmission data) outputted from each transmitting antenna 130A and 130B is $s_1$ and $s_2$, and the received signal received by each receiving antenna 210A and 210B is $r_1$ and $r_2$. Furthermore, suppose the channel response of the signal outputted from transmitting antenna 130A and received by receiving antenna 210A is $h_{11}$ and the channel response of the signal outputted from transmitting antenna 130B and received by receiving antenna 210A is $h_{12}$. Furthermore, suppose the channel response of the signal outputted from transmitting antenna 130A and received by receiving antenna 210B is $h_{21}$ and the channel response of the signal outputted from transmitting antenna 130B and received by receiving antenna 210B is $h_{22}$. MIMO transmission in this case is expressed by equation 1.

(Equation 1)

$$\begin{pmatrix} r_1 \\ r_2 \end{pmatrix} = \begin{pmatrix} h_{11} & h_{12} \\ h_{21} & h_{22} \end{pmatrix} \begin{pmatrix} s_1 \\ s_2 \end{pmatrix} + \begin{pmatrix} n_1 \\ n_2 \end{pmatrix} \quad [1]$$

In equation 1, $n_1$ and $n_2$ are thermal noise.

[Configuration of Modulation Section of Transmitting Apparatus]

Figure 3:
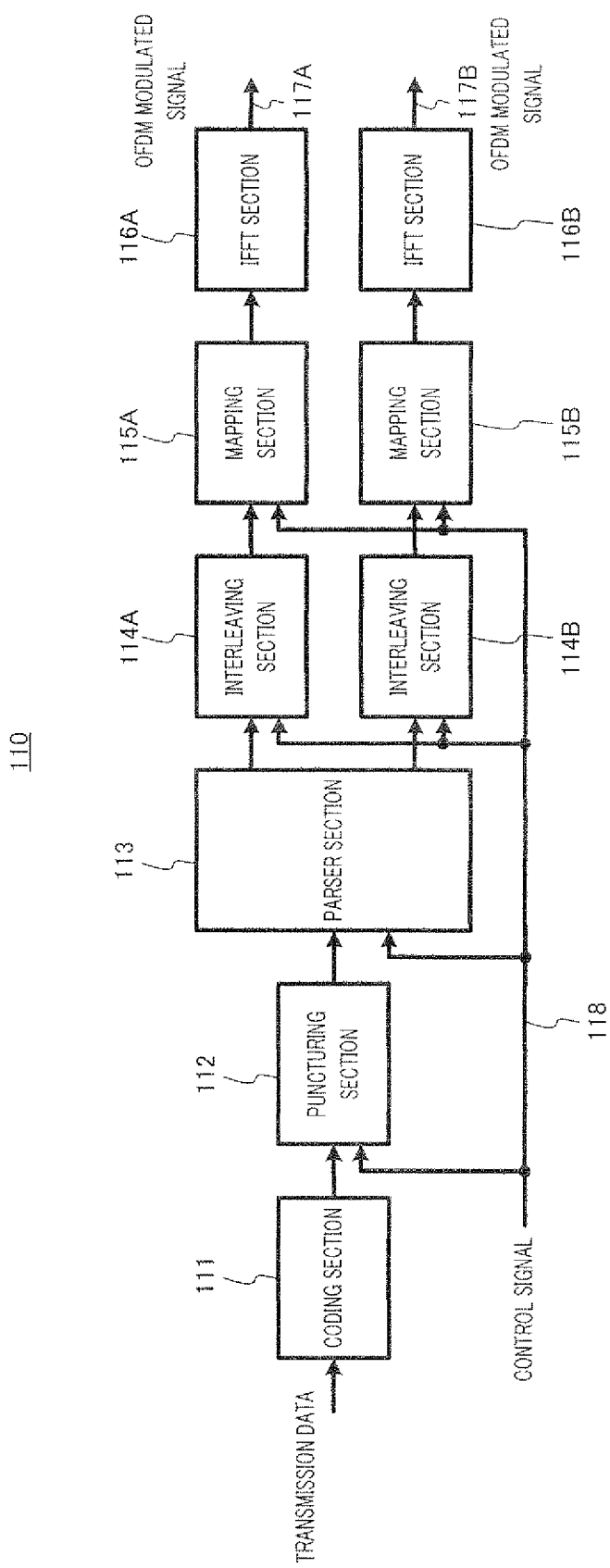
FIG. 3 shows a transmitting apparatus according to Embodiment 1.

FIG. 3 shows a configuration example of modulation section 110 of transmitting apparatus 100 shown in FIG. 2. In FIG. 3, modulation section 110 includes coding section 111, puncturing section 112, parser section 113, interleaving sections 114A and 114B, mapping sections 115A and 115B and IFFT (Inverse Fast Fourier Transform) sections 116A and 116B. Coding section 111 receives transmission data as input, and applies convolutional coding, which is error correction coding, to transmission data. Coding section 111 then outputs data coded at, for example, a coding rate 1/2. A configuration example of coding section 111 in this case is shown in FIG. 4.

Figure 4:
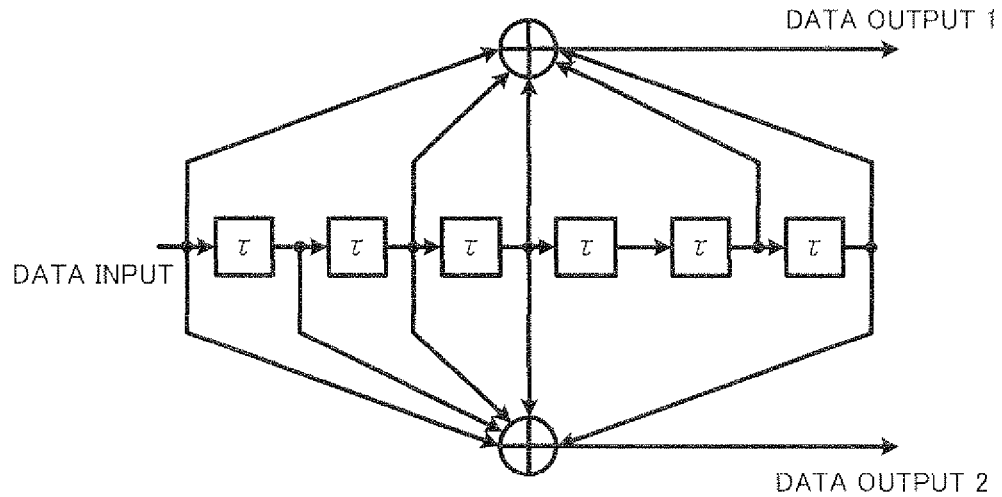
FIG. 4 shows the coding section according to Embodiment 1.

As shown in FIG. 4, coding section 111 (i.e. convolutional coder) has a configuration including a plurality of shift registers ($\tau$) and XOR circuits. The shift register ($\tau$) receives as input data to be coded one bit at a time, and outputs the data to the XOR circuit. Each XOR circuit outputs the XOR calculation result as encoded data. To output two bits per one-bit input, coding section 111 in FIG. 4 generates a convolutional code of a coding rate 1/2.

Referring back to FIG. 3, puncturing section 112 receives as input the data encoded in coding section 111 and control signal 118, and applies puncturing processing whereby the input data is removed in a certain pattern. Puncturing section 112 then outputs data with a changed coding rate. However, in the case of data transmission at a coding rate 1/2, puncturing section 112 outputs input data from coding section 111 on an as is basis. Suppose control signal 118 is a signal indicating the modulation scheme and coding rate of the data part in a transmission packet and is provided as input from outside.

Figure 5:
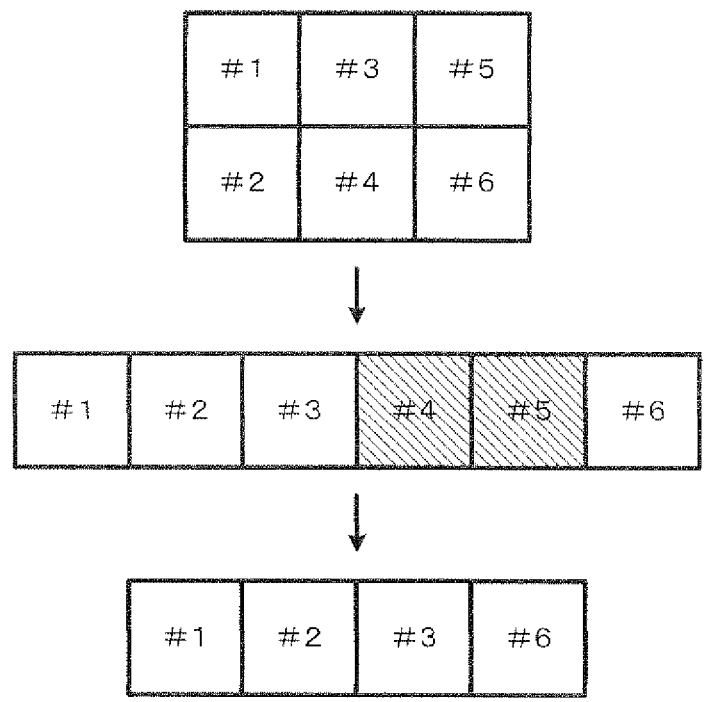
FIG. 5 illustrates an example of the puncturing method according to Embodiment 1.

Here, the method of puncturing data of a coding rate 1/2 to data of a coding rate 3/4 will be explained with reference to FIG. 5. In this case, first suppose data is received as input in units of 6 bits (e.g. #1 to #6). Next, two out of six bits (e.g. #4, #5) are removed. The remaining four bits (e.g. in the order of #1 to #3, and then #6) are outputted. This output causes the data to be punctured to a coding rate 3/4. By the way, the puncturing method is not limited to the case illustrated in FIG. 5 and may adopt any method as long as bits are removed by a certain rule.

Parser section 113 in FIG. 3 receives the punctured data and control signal 118 as input, selects a predetermined rule according to control signal 118 and converts the data received as input from serial to parallel according to that rule. An example of the serial/parallel conversion rule in this case is a method of repeating input data in order of output 1, output 2, output 1, . . . . The serial/parallel conversion rule is not limited to the above-described rule, and may adopt a method of classifying input bits into a plurality of consecutive bits and repeating the outputs in that unit in order of output 1, output 2, output 1, . . . .

Interleaving section 114A receives as input one part of the data classified by parser section 113 and control signal 118, and applies processing whereby the order of input data is rearranged based on control signal 118. Interleaving section 114A then outputs the rearranged data.

Figure 6:
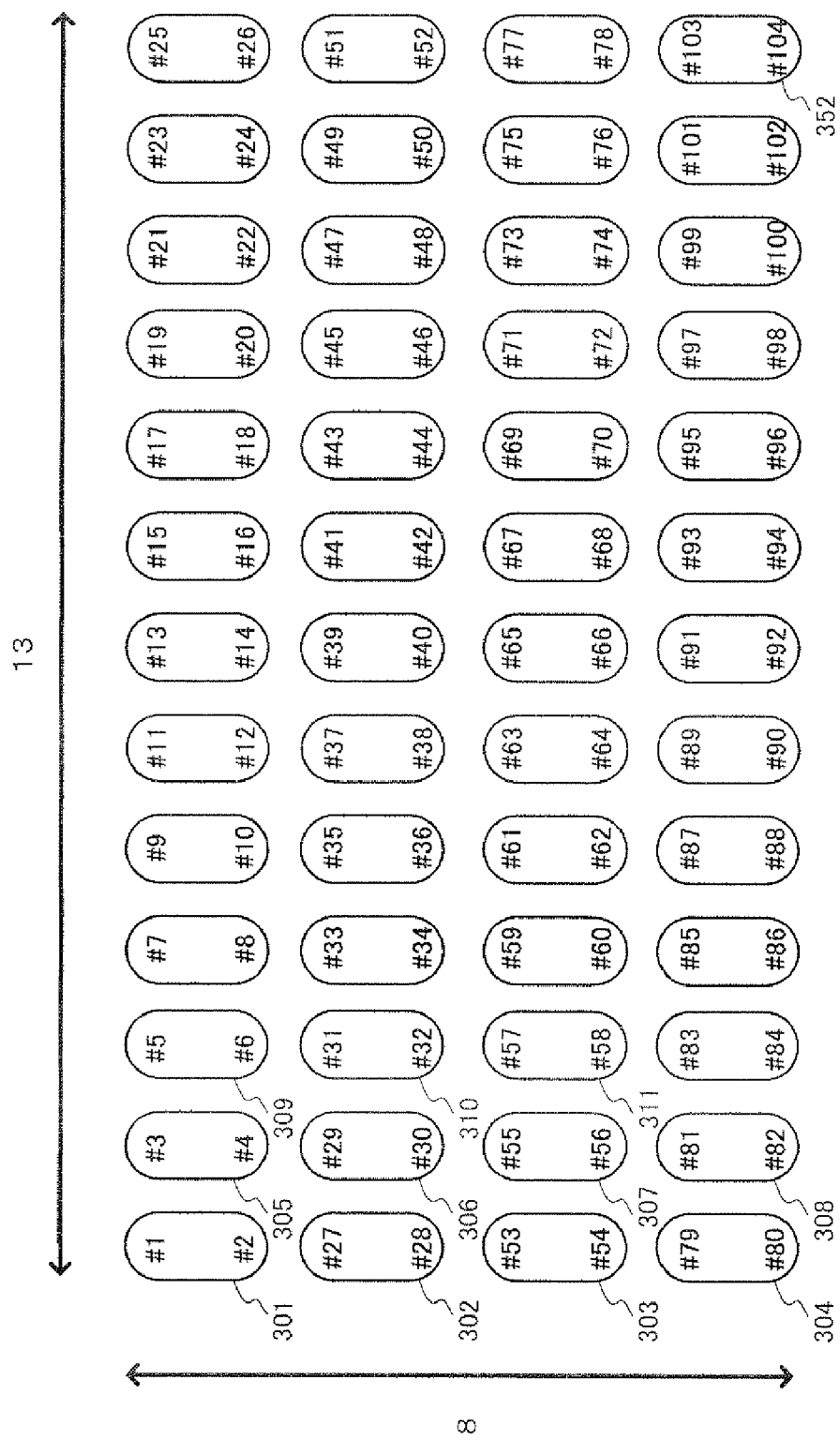
FIG. 6 illustrates an example of the interleaving rule according to Embodiment 1.

Here, an example of interleaving processing based on the QPSK (Quadrature Phase Shift Keying) modulation scheme will be explained with reference to FIG. 6. Upon interleaving, serial data that is received in units of 104 bits is subjected to processing of reordering bits within the units, FIG. 6 shows, for example, a storage area of a 13-bit width and an 8-bit depth. Numbers #1, #2, . . . , #104 in the figure denote the order data (bits) is received as input. In FIG. 6, #1, #2, . . . , #104 are arranged in order from the top left of the storage area. Data is then read in order of, for example, subcarriers 301, 302, 303, 304, 305, . . . , 311, . . . , 352. The data read from the storage area then becomes a data sequence of #1, #2, #27, #28, #53, #54, #79, #80, #3, #4, #29, #30, . . . , #104. The above-described interleaving processing makes it possible to distribute burst errors that occur on a continuous basis under the influence of fading whereby a received signal temporally varies. Thus, receiving apparatus 200 can more easily provide an error correction effect and improve the reception performance.

In the case of a modulation scheme in which a plurality of bits are mapped to one symbol point (16QAM, 64QAM (Quadrature Amplitude Modulation), and so on), the order of bits mapped to the same symbol may be rearranged so as to provide a bit sequence that is received seamlessly, Alternatively, in the case of the BPSK (Binary Phase Shift Keying) modulation scheme, one bit is mapped to one symbol. In this case, writing is performed rightward from the top left of the 13-bit wide and 4-bit deep storage area. On the other hand, reading is performed downward from the top left of the storage area.

Mapping section 115A in FIG. 3 receives as input the interleaved data from interleaving section 114A and control signal 118. Mapping section 115A selects the modulation scheme according to the control signal and maps the input data on a complex plane made up of I signals and Q signals. Mapping is performed using modulation schemes such as BPSK, QPSK, 16QAM and 64QAM and a signal mapped on the complex plane is outputted.

IFFT section 116A receives as input the signal mapped by mapping section 115A. IFFT section 116A then applies OFDM modulation through IFFT processing and outputs OFDM modulated signal 117A.

Interleaving section 114B, mapping section 115B and IFFT section 116B also apply the same processing as in interleaving section 114A, mapping section 115A and IFFT section 116A, and IFFT section 116B outputs OFDM modulated signal 117B.

[Frame Format of Transmission Signal]

Figure 7:
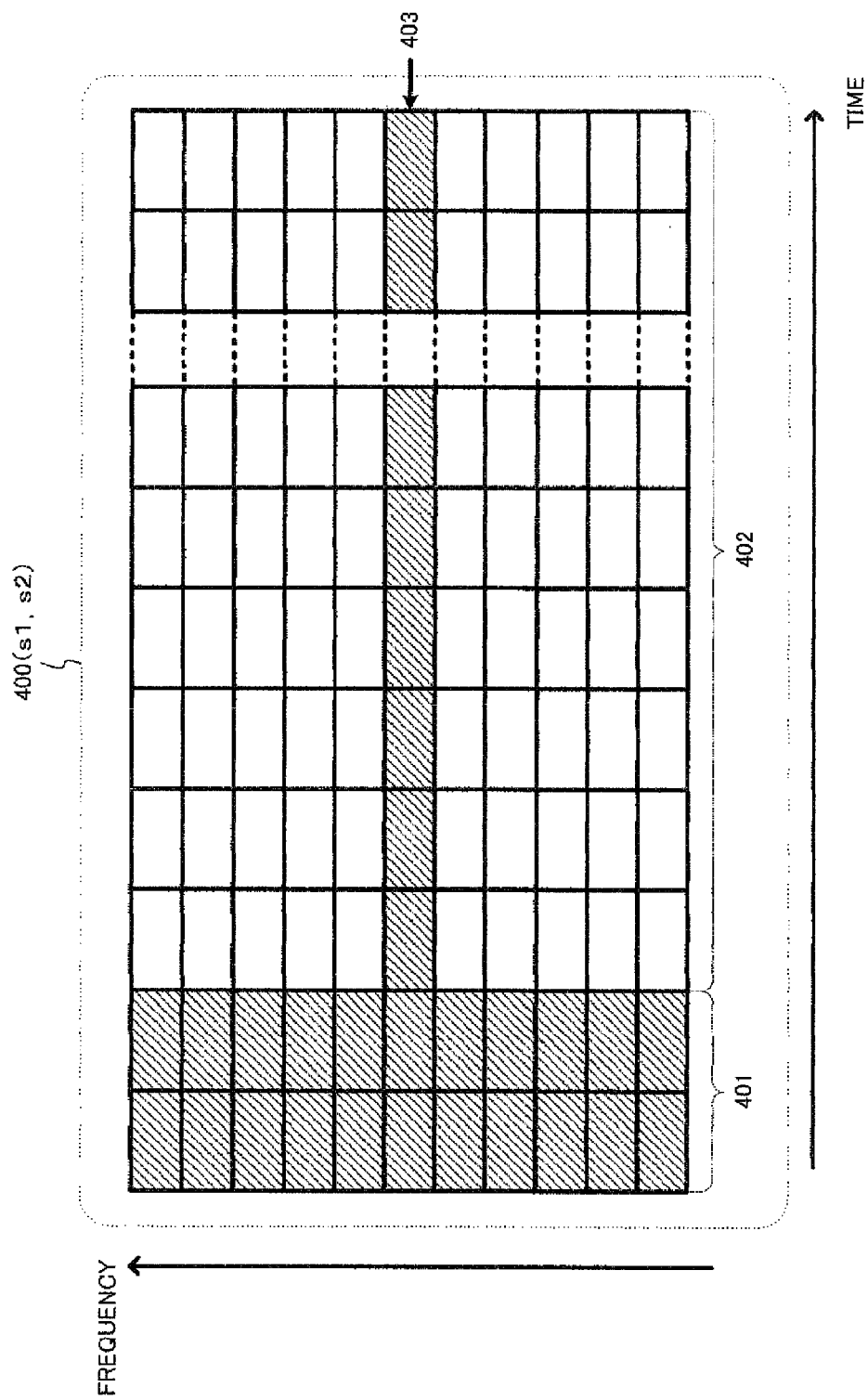
FIG. 7 shows an example of a transmission frame format according to Embodiment 1.

FIG. 7 shows an example of a frame format of transmission signal s1 and s2. The rectangle of FIG. 7 is one OFDM symbol. Transmission signal 400 (s1, s2) is configured by including preamble 401, transmission data 402 and pilot 403. Preamble 401 is a known signal for perform synchronization processing, channel estimation and so on in receiving apparatus 200. Transmission data 402 is data which is the entity of the transmission signal. Pilot 403 is a known signal for receiving apparatus 200 to estimate the frequency error between transmitting apparatus 100 and receiving apparatus 200.

[Configuration of Demodulation Section of Transmitting Apparatus]

Figure 8:
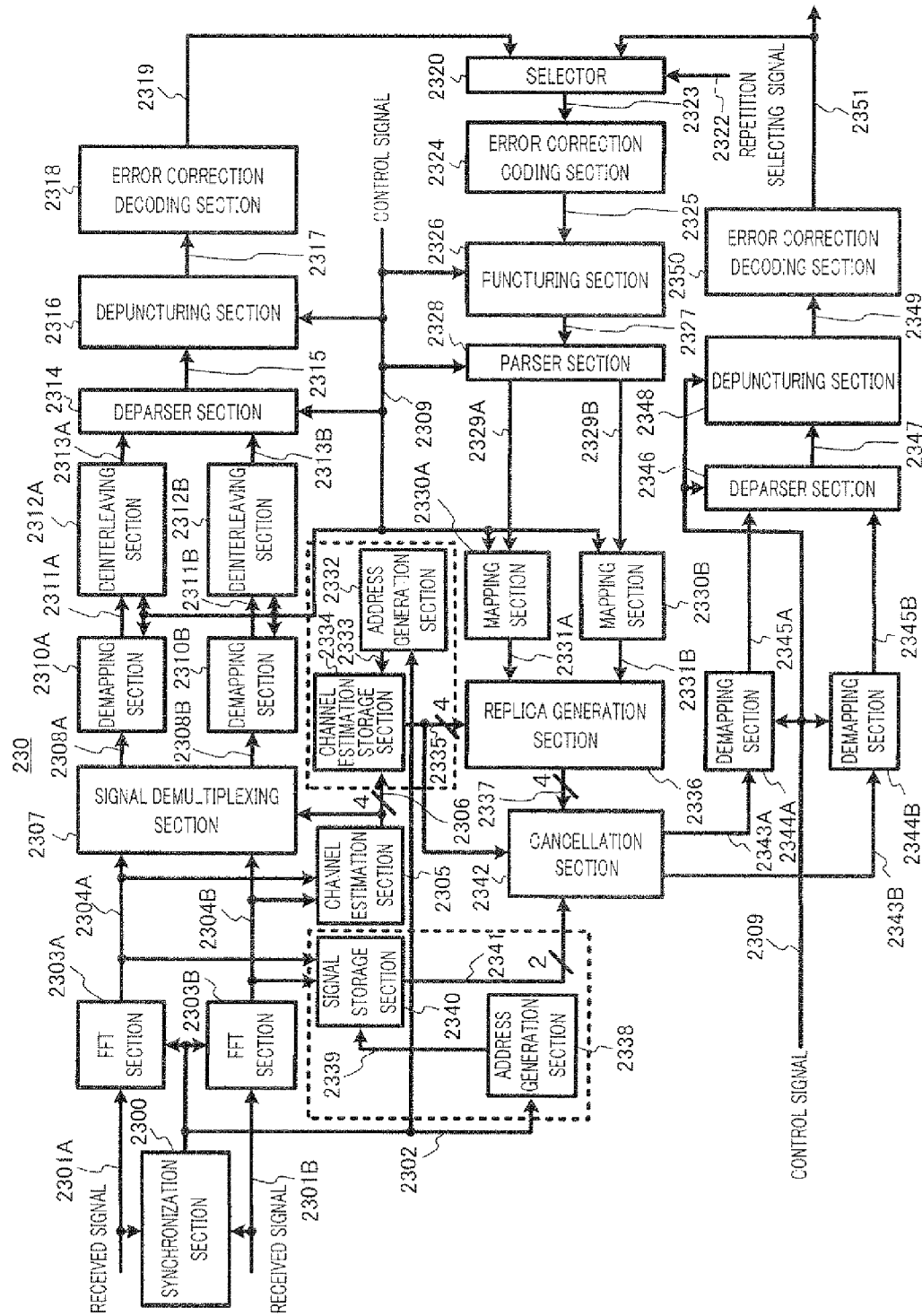
FIG. 8 shows a configuration example of a receiving apparatus according to Embodiment 1.

FIG. 8 shows a configuration example of demodulation section 230 of receiving apparatus 200 shown in FIG. 2. In FIG. 8, demodulation section 230 includes synchronization section 2300, FFT sections 2303A and 2303B, channel estimation section 2305, signal demultiplexing section 2307, demapping sections 2310A and 2310B, deinterleaving sections 2312A and 2312B, deparser section 2314, depuncturing section 2316 and error correction decoding section 2318. Furthermore, demodulation section 230 includes selector 2320, error correction coding section 2324, puncturing section 2326, parser section 2328, mapping sections 2330A and 2330B, address generation section (first conversion section) 2332, channel estimation storage section (first storage section) 2334, replica generation section (re-modulation section) 2336 and cancellation section 2342. Furthermore, demodulation section 230 includes address generation section (second conversion section) 2338, signal storage section (second storage section) 2340, demapping sections 2344A and 2344B, deparser section 2346, depuncturing section 2348 and error correction decoding section 2350.

By including the above-described components, demodulation section 230 repeats demodulation processing. That is, receiving apparatus 200 is a receiving apparatus based on an iterative decoding scheme. According to an iterative decoding scheme, a received signal is demodulated once and then re-modulated to generate a replica signal. The replica signal is subtracted from the spatial-multiplexed received signal. Having had the interference signal removed through this subtraction, the signal is demodulated again. This re-modulation and re-demodulation may be repeated.

Synchronization section 2300 receives as input baseband signals (i.e. received signals) 2301A and 2301B outputted from radio section 220 (see FIG. 2). Synchronization section 2300 then performs synchronization processing on the baseband signals and outputs a timing signal (i.e. timing control signal) 2302. The above-described synchronization processing determines the correlation between a known signal added at the beginning of the transmission signal and the received signal. When a correlation value exceeding a predetermined threshold is calculated, timing signal 2302 (i.e. synchronization signal) is generated.

FFT section 2303A receives as input baseband signal 2301A and timing signal 2302. At the time timing signal 2302 is received as input, FFT section 2303A applies FFT processing to baseband signal 2301A received as input, and outputs OFDM demodulated signal 2304A. FFT section 2303B also performs the same processing as in FFT section 2303A, and outputs OFDM demodulated signal 2304B.

Channel estimation section 2305 receives as input OFDM demodulated signals 2304A and 2304B. Channel estimation section 2305 estimates channel responses $h_{11}, h_{12}, h_{21}$ and $h_{22}$ shown in FIG. 2 using preamble 401 (see FIG. 7) in the transmission signal and outputs channel estimate value (i.e. channel estimation information) 2306.

Signal demultiplexing section 2307 receives as input OFDM demodulated signals 2304A and 2304B and channel estimate value 2306. Signal demultiplexing section 2307 then applies processing of demultiplexing the spatial-multiplexed OFDM demodulated signal into streams using channel estimate value 2306 and outputs signal streams 2308A and 2308B. In this case, there are three types of method for demultiplexing a signal into streams: ZF (Zero Forcing), MMSE (Minimum Mean Square Error) and MLD (Maximum Likelihood Detection). The present embodiment will be explained assuming that ZF is adopted.

Here, MIMO transmission according to the present embodiment is expressed as shown in equation 1. In this case, channel response matrix H in equation 1 is expressed by equation 2. From the left side of equation 1, conversion equation 3 is obtained through a multiplication by an inverse matrix of H in equation 2.

(Equation 2)

$$H = \begin{pmatrix} h_{11} & h_{12} \\ h_{21} & h_{22} \end{pmatrix} \quad [2]$$

(Equation 3)

$$\begin{pmatrix} s'_1 \\ s'_2 \end{pmatrix} = H^{-1} \begin{pmatrix} r_1 \\ r_2 \end{pmatrix} \quad [3]$$

The spatial-multiplexed signal can be demultiplexed by calculating s1' and s2' in equation 3.

Demapping section 2310A receives as input signal stream 2308A and control signal 2309. Demapping section 2310A then applies demapping processing of BPSK, QPSK, 16QAM or 64QAM according to control signal 2309 and outputs likelihood 2311A. Here, control signal 2309 sets values indicating the modulation scheme, coding rate and so on of the received signal. Data indicating the modulation scheme and coding rate of the received signal may also be included in part of the received signal. In this case, assuming the data included in the received signal is data generated by a known modulation scheme and coding rate, this data is decoded first. Furthermore, although not shown, the receiving apparatus is provided with a control section that generates a control signal based on the decoding result. Here, an example of a method of calculating likelihood will be explained. The Euclidean distance between a received signal point and a transmitted candidate signal point is calculated. A value that minimizes the calculated Euclidean distance is outputted as the likelihood of the received signal.

Deinterleaving section 2312A receives as input likelihood 2311A and control signal 2309. Deinterleaving section 2312A then applies processing of restoring the order rearranged by interleaving section 114A shown in FIG. 3 back to the original order, and outputs deinterleaved data 2313A.

Figure 9:
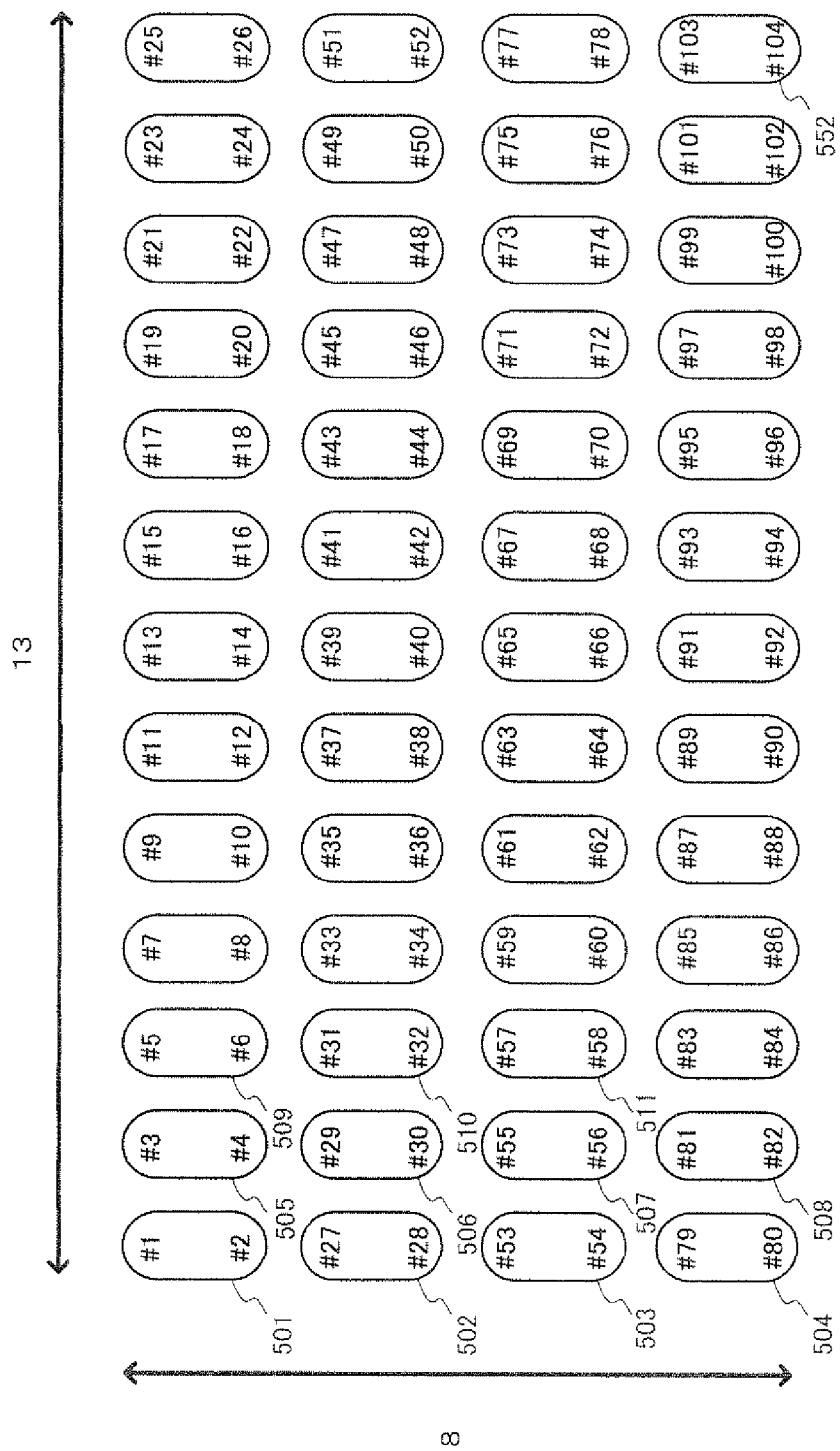
FIG. 9 illustrates an example of the deinterleaving rule according to Embodiment 1.

Here, taking a case with the QPSK modulation scheme assuming the number of bits per OFDM symbol is 104 as an example, deinterleaving processing will be explained with reference to FIG. 9. In the deinterleaving processing, the input bit sequence is rearranged in order and outputted, according to a predetermined rule. In FIG. 9, a storage area of a 13-bit width and 8-bit depth is used. The input bit sequence is received as input in subcarrier units (in the order of subcarriers 501, 502, 503, 504, 505, . . . , 511, . . . , 552: vertically of the figure) and written into the storage area. On the other hand, the output bit sequence is read in bit units (in the order of #1, #2, #3, . . . , #104: horizontally of the figure) from the storage area and outputted. A storage area of a 13-bit width and 8-bit depth is used above, but the storage area is not limited to this and any storage area may be used if the input and output data sequences are at least rearranged according to the above-described relationship.

Demapping section 2310B and deinterleaving section 2312B in FIG. 8 apply the same processing as in demapping section 2310A and deinterleaving section 2312A, and output data.

Deparser section 2314 receives as input deinterleaved data 2313A and 2313B and control signal 2309. Deparser section 2314 applies processing of converting data 2313A and 2313B to a serial data sequence, and outputs deparsed data 2315. The rule for converting parallel data to serial data in the deparser is opposite to the rule in parser section 113 shown in FIG. 3.

Depuncturing section 2316 receives as input output data 2315 of deparser section 2314 and control signal 2309. Depuncturing section 2316 then applies depuncturing processing according to control signal 2309 and outputs depunctured data 2317. Depuncturing inserts neutral likelihood information at positions of bits removed according to the rule shown in FIG. 5 and performs processing of restoring the same number of bits as in the data sequence before puncturing section 112 performs puncturing processing.

Error correction decoding section 2318 receives as input depunctured data 2317. Error correction decoding section 2318 then applies error correction decoding processing to data 2317 and outputs primary decoded data 2319. For example, Viterbi decoding is used for the error correction decoding processing. Viterbi decoding is known as a representative decoding method using a convolutional code. Furthermore, error correction decoding section 2318 demodulates primary decoded data 2319 and then performs re-modulation processing to perform signal demultiplexing for a second time. Error correction decoding section 2318 then performs processing of canceling interference components using the data subjected to re-modulation processing and the received signal and performs re-demodulation. This processing will be explained below.

Selector 2320 receives as input as input primary decoded data 2319, iterative decoded data 2351 and repetition selecting signal 2322. Selector 2320 then selects primary decoded data 2319 or iterative decoded data in response to the input from repetition selecting signal 2322 and outputs bit data 2323. Repetition selecting signal 2322 outputs primary decoded data 2319 as bit data 2323 when the received signal is re-modulated for the first time, and outputs iterative decoded data 2351 as bit data 2323 from a second time onward.

Error correction coding section 2324 receives bit data 2323 as input, applies convolutional coding and outputs encoded data 2325. In this case, error correction coding section 2324 performs convolutional coding using the plurality of shift registers ($\tau$) and XOR circuits shown in FIG. 4.

Puncturing section 2326 receives as input convolutional coded data 2325 and control signal 2309. Puncturing section 2326 then applies puncturing processing according to control signal 2309 and outputs punctured data 2327. The puncturing processing is performed according to the same rule as in FIG. 5.

Parser section 2328 receives as input punctured data 2327 and control signal 2309. Parser section 2328 then applies parser processing whereby serial punctured data 2327 that is received as input, is converted into parallel data, and outputs two data sequences 2329A and 2329B. The parser processing is the same as the processing in parser section 113 in FIG. 3.

Mapping section 2330A receives parsed data sequence 2329A and control signal 2309, applies BPSK, QPSK, 16QAM or 64QAM modulation processing according to the control signal and outputs modulated signal 2331A. Mapping section 2330B also performs the same processing as in mapping section 2330A, and outputs modulated signal 2331B.

Address generation section 2332 receives as input timing signal 2302 outputted from synchronization section 2300, generates a write address, read address and so on for controlling channel estimation storage section 2334, and outputs control signal 2333 generated.

Channel estimation storage section 2334 receives as input channel estimate value 2306 outputted from channel estimation section 2305 and control signal 2333. Channel estimation storage section 2334 then performs processing of writing or reading a channel estimate value according to control signal 2333 and outputs channel estimate value 2335.

Figure 10:
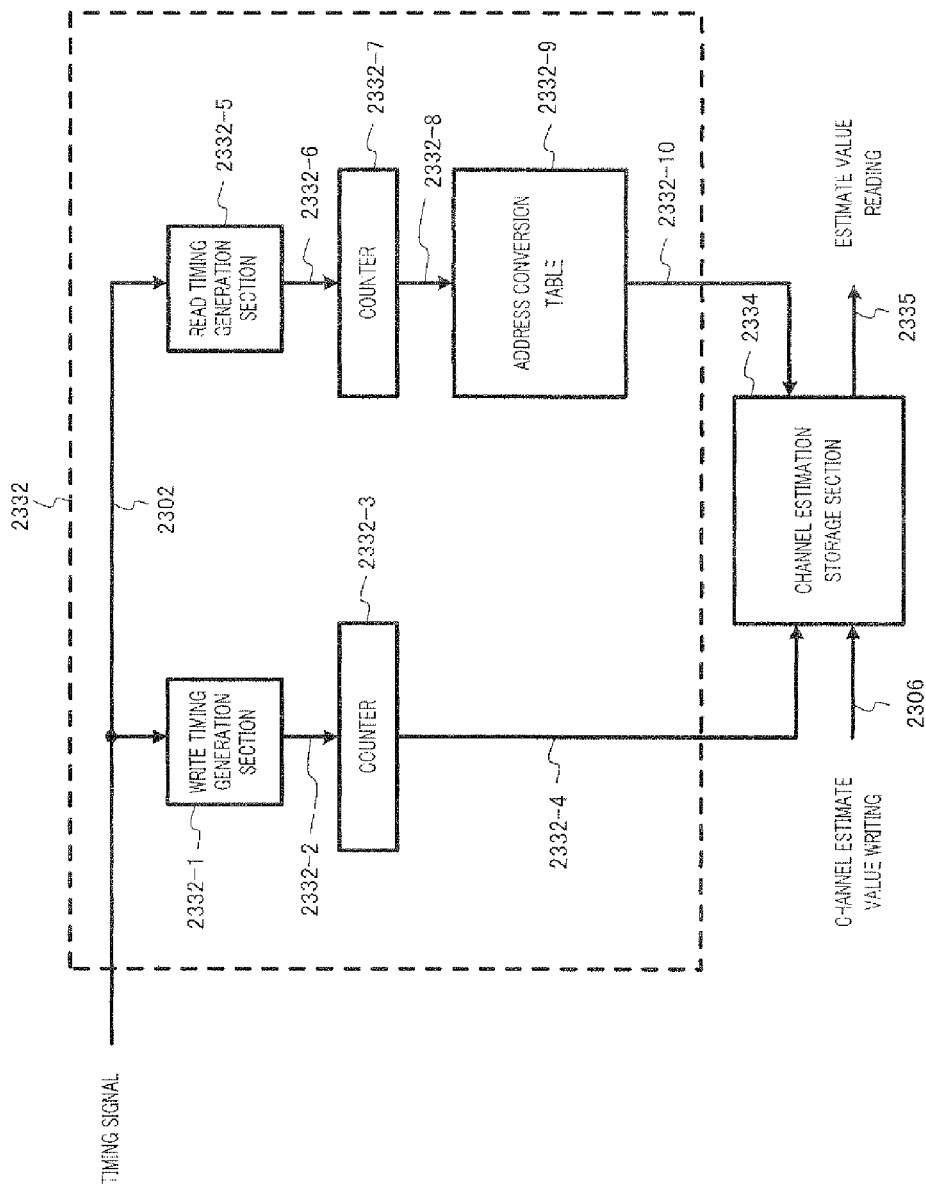
FIG. 10 shows a configuration example of the address generation section and channel estimation storage section.

Here, a configuration example of address generation section 2332 and channel estimation storage section 2334 will be explained in detail with reference to FIG. 10. In FIG. 10, address generation section 2332 has write timing generation section 2332-1 and counter 2332-3. Furthermore, address generation section 2332 has read time generation section 2332-5, counter 2332-7 and address conversion table 2332-9. Write timing generation section 2332-1 receives as input timing signal 2302 outputted from synchronization section 2300. Write timing generation section 2332-1 then generates counter control signal 2332-2 for controlling counter 2332-3 at the time in accordance with channel estimate value 2306 to input in channel estimation storage section 2334 using timing signal 2302. Furthermore, write timing generation section 2332-1 outputs counter control signal 2332-2 generated. In FIG. 10, address conversion table 2332-9 is illustrated to be on the reading side but may be provided only on the writing side (i.e. the output side of counter 2332-3).

Counter 2332-3 counts up on the counter according to counter control signal 2332-2 received as input. Counter 2332-3 then generates and outputs write address 2332-4 of channel estimation storage section 2334.

Read time generation section 2332-5 receives as input timing signal 2302. Read time generation section 2332-5 then generates and outputs counter control signal 2332-6 for controlling counter 2332-7 at the time channel estimate value 2306 is read from channel estimation storage section 2334 based on timing signal 2302.

Counter 2332-7 counts up on a counter signal to generate an address for reading channel estimate value 2306 from channel estimation storage section 2334 according to counter control signal 2332-6 received as input. Counter 2332-7 then outputs generated read counter signal 2332-8.

Address conversion table 2332-9 receives as input read counter signal 2332-8. Address conversion table 2332-9 then converts the input signal counted up to a read address according to read counter signal 2332-8 and outputs read address signal 2332-10. Address conversion table 2332-9 stores in advance a table for converting the input signal to a read address, and converts the input signal to a read address with reference to this table.

Address conversion table 2332-9 stores input values and output in association with each other, as shown, for example, in FIG. 11. For example, when a value of "0" is received as input from counter 2332-7 (see FIG. 10), address conversion table 2332-9 reads the value "0" that corresponds to the input value of 0, to channel estimation storage section 2334 (see FIG. 10). On the other hand, when a value of "1" is received as input from counter 2332-7 (see FIG. 10), address conversion table 2332-9 reads the value "13" that corresponds to the input value of 1, to channel estimation storage section 2334 (see FIG. 10). Furthermore, when a value of "2" is received as input from counter 2332-7 (see FIG. 10), address conversion table 2332-9 reads the value "27" that corresponds to the input value of 2, to channel estimation storage section 2334 (see FIG. 10).

Channel estimation storage section 2334 receives as input write address 2332-4, channel estimate value 2306 and read address signal 2332-10. Channel estimation storage section 2334 then writes channel estimate value 2306 into the storage area specified by the write address. Furthermore, channel estimation storage section 2334 reads and outputs channel estimate value 2306 stored in the storage area specified by the read address. Channel estimation is performed using preamble 401, which is a known signal added at the beginning of the received data frame, and the channel estimation result is written in channel estimation storage section 2334. Thus, channel estimation storage section 2334 may secure an area for one symbol.

By combining above-described counters 2332-3 and 2332-7, address conversion table 2332-9 and channel estimation storage section 2334, input data is outputted in a rearranged order. To be more specific, when counter 2332-3 receives data as input, counter 2332-3 counts up on the input counter and writes the input data at the address in channel estimation storage section 2334 indicated by the input counter. When counter 2332-7 receives data as input, counter 2332-7 counts up on the output counter and inputs the value given on the output counter, to address conversion table 2332-9. Address conversion table 2332-9 reads the output value (see FIG. 11) associated with the input value. Channel estimation storage section 2334 stores the data at the address indicated by the read, output value. By this means, channel estimation storage section 2334 writes and reads data in the read address (i.e. storage area) and thereby rearranges the input data sequence in a different order, and outputs the rearranged data sequence. In this case, the order of rearrangement can be easily changed by changing the values to set up in the address conversion table.

Figure 12:
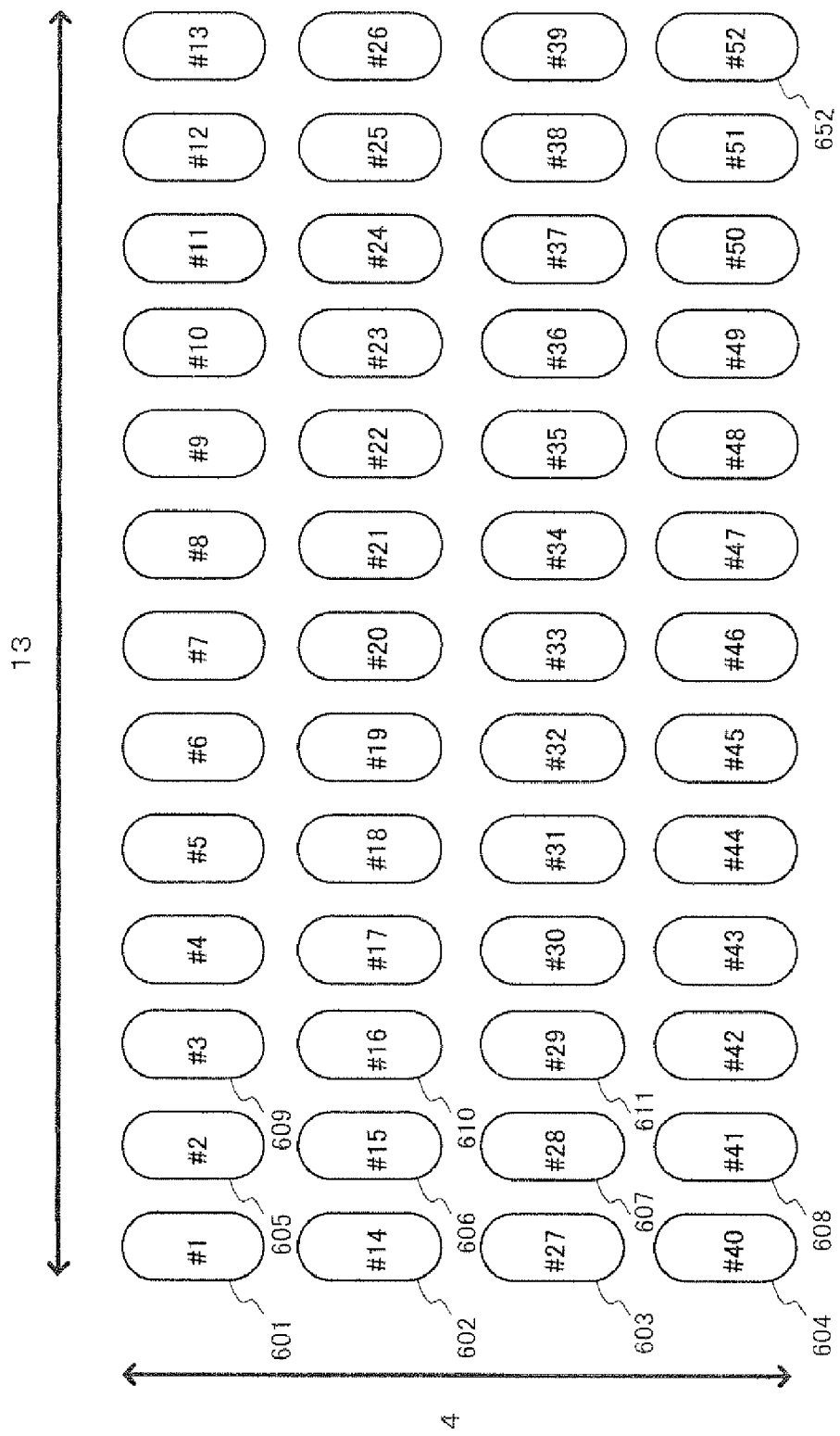
FIG. 12 illustrates an example of the symbol deinterleaving rule according to Embodiment 1.

Here, the rule for rearranging the data sequence of channel estimate value 2306 will be explained with reference to FIG. 12. FIG. 12 shows a 13-symbol wide, 4-symbol deep storage area for storing channel estimate values. Since channel estimate values are data provided in subcarrier units, the channel estimate values are rearranged in subcarrier units. In FIG. 12, an input bit sequence is received as input in the order of subcarriers 601, 602, 603, 604, 605, ..., 611, ..., 652, and written vertically in a predetermined storage area in FIG. 12. The output bit sequence is read and outputted from the storage area horizontally in FIG. 12, in order of subcarrier indexes #1, #2, #3, . . . , #52.

Replica generation section 2336 in FIG. 8 re-modulates the data sequence based on the channel estimate value and generates re-modulated data. To be more specific, replica generation section 2336 receives as input channel estimate value 2335 read from channel estimation storage section 2334 and modulated signals 2331A and 2331B outputted from mapping sections 2330A and 2330B. Replica generation section 2336 then generates and outputs replica signal 2337 for each stream received by each receiving antenna 210A and 210B. Replica signals ($h_{11}'s_1'$, $h_{12}'s_2'$, $h_{21}'s_1'$, $h_{22}'s_2'$) are obtained by multiplying channel estimate values $h_{11}'$, $h_{12}'$, $h_{21}'$ and $h_{22}'$, which estimate propagation paths $h_{11}$, $h_{12}$, $h_{21}$ and $h_{22}$, by re-modulated signals $s_1'$ and $s_2'$.

Address generation section 2332 receives as input timing signal 2302 outputted from synchronization section 2300. Address generation section 2332 then generates and outputs control signal 2339 for controlling the write address or read address of signal storage section 2340 at the time timing signal 2302 is received as input.

Signal storage section 2340 receives as input control signal 2339 and OFDM demodulated signals 2304A and 2304B. Signal storage section 2340 then writes or reads OFDM demodulated signal 2341 at the address specified by control signal 2339. Furthermore, signal storage section 2340 outputs read OFDM demodulated signal 2341.

Figure 13:
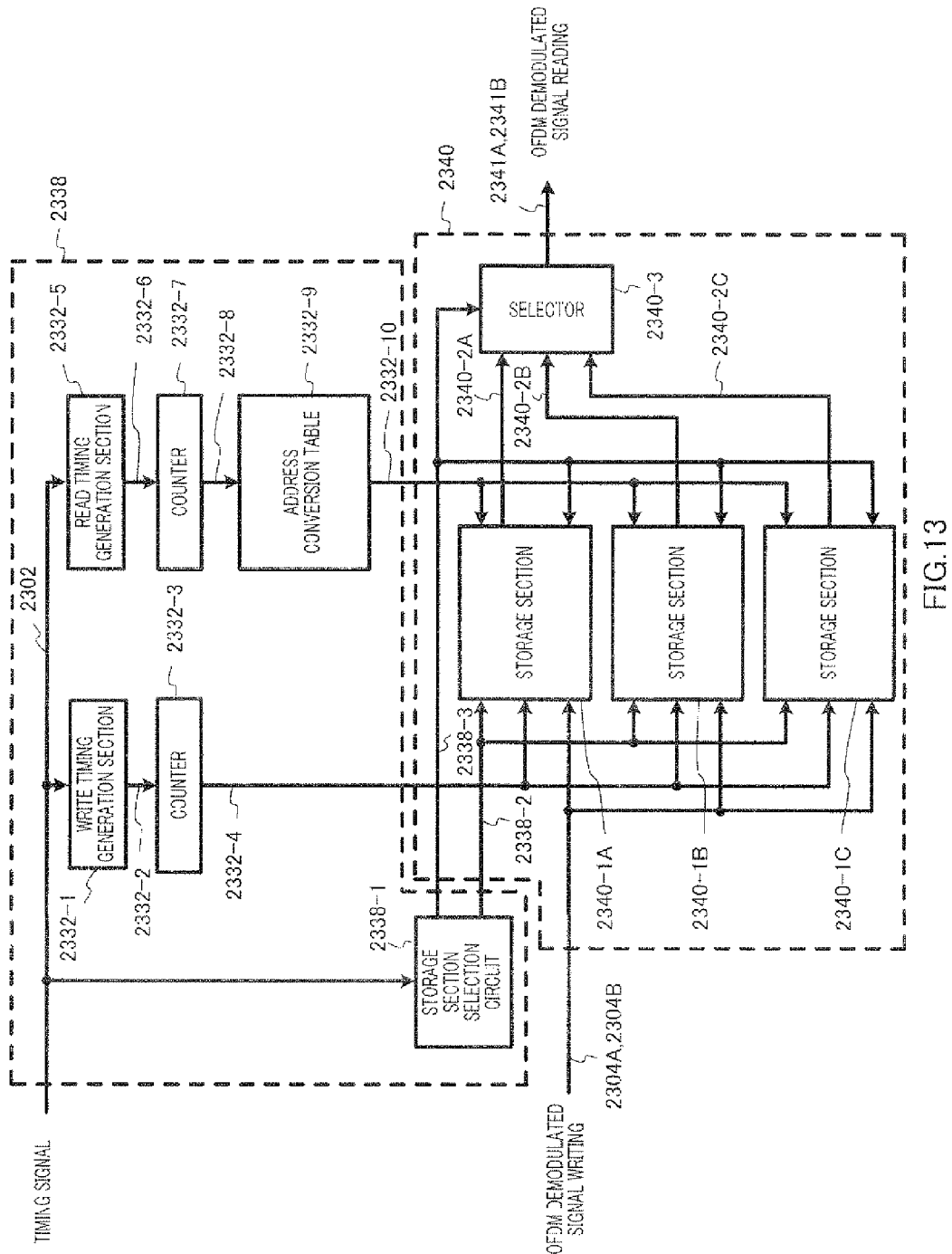
FIG. 13 shows a configuration example of the address generation section and signal storage section.

Here, a configuration example of address generation section 2338 and signal storage section 2340 will be explained in detail with reference to FIG. 13. Furthermore, the same parts as in FIG. 10 will be assigned the same reference numerals and explanations of their operations will be omitted. In FIG. 13, address generation section 2338 includes write timing generation section 2332-1, counter 2332-3, read time generation section 2332-5, counter 2332-7 and address conversion table 2332-9 (see FIG. 10) and storage section selection circuit 2338-1 as well. Storage section selection circuit 2338-1 receives as input timing signal 2302 outputted from synchronization section 2300. Storage section selection circuit 2338-1 then generates a control signal for selecting a storage section (2340-1A, 2340-1B, 2340-1C) to/from which an OFDM demodulated signal is written or read, and outputs write storage section selection signal 2338-2 or read storage section selection signal 2338-3.

Write storage section selection signal 2338-2 is designed to perform control such that an OFDM demodulated signal received is stored in storage sections 2340-1A, 2340-1B and 2340-1C, each of which is selected for each OFDM symbol in that order. Read storage section selection signal 2338-3 is designed to perform control such that OFDM symbols are extracted from a read OFDM demodulated signal in order starting from the first-stored OFDM symbol.

Signal storage section 2340 includes three storage sections 2340-1A to 2340-1C and selector 2340-3. Storage section 2340-1A receives as input any arbitrary signal of write storage section selection signal 2338-2, read storage section selection signal 2338-3, write address 2332-4, read address signal 2332-10 and OFDM demodulated signals 2304A and 2304B. Storage section 2340-1A then writes the OFDM signal into a storage area specified by write address 2332-4 or reads the OFDM signal from a storage area specified by a read address. Furthermore, storage section 2340-1A outputs read OFDM signal 2340-2A. Storage sections 2340-1B and 2340-1C also perform the same processing as in storage section 2340-1A and output OFDM signals 2340-2B and 2340-2C respectively.

Storage sections 2340-1A to 2340-1C output an OFDM demodulated signal in synchronization with the timing replica signal 2337 is received as input, required when cancellation section 2342 performs canceller processing. For this reason, storage sections 2340-1A to 2340-1C need to secure a storage area to cumulate OFDM demodulated signals received until replica signal 2337 is generated. In FIG. 13, a case has been explained where signal storage section 2340 has three storage sections, but the number of storage sections may be changed.

Selector 2340-3 receives as input OFDM signals 2340-2A, 2340-2B and 2340-2C read from storage sections 2340-1A, 2340-1B and 2340-1C, and read storage section selection signal 2338-3. Selector 2340-3 then selects the output from a predetermined storage section (2340-1A, 2340-1B, 2340-1C) according to read storage section selection signal 2338-3, and outputs each OFDM demodulated signal 2341A and 2341B (this may be expressed by "2341").

The rule for rearranging the data sequences of OFDM demodulated signals 2341A and 2341B is the same as the channel estimate value rearrangement rule shown in FIG. 12.

Cancellation section 2342 in FIG. 8 receives OFDM demodulated signal 2341 as input, replica signal 2337 and channel estimate value 2335. Cancellation section 2342 then subtracts replica signal 2337 from OFDM demodulated signal 2341, and extracts a streaming signal having canceled its interference. Furthermore, cancellation section 2342 combines signals using channel estimate value 2335 taking into account the phases and amplitudes between the receiving antennas. Cancellation section 2342 then outputs signal streams 2343A and 2343B with their interference signals canceled.

Demapping section 2344A receives as input signal stream 2343A and control signal 2309. Demapping section 2344A then applies demapping processing based on a modulation scheme (BASK, QPSK, 16QAM, 64QAM and so on) according to control signal 2309 and outputs likelihood 2345A. The likelihood calculation method is the same as the method in demapping section 2310A used in the first demodulation processing. Demapping section 2344B also performs the same processing as in demapping section 2344A, and outputs likelihood 2345B.

Deparser section 2346 receives likelihoods 2345A and 2345B as input, and control signal 2309 and applies the same processing as in deparser section 2314. Deparser section 2346 then outputs deparsed data 2347.

Depuncturing section 2348 receives deparsed data 2347 and control signal 2309 as input. Depuncturing section 2348 then applies depuncturing the same processing as in depuncturing section 2316 according to control signal 2309 and outputs depunctured data 2349.

Error correction decoding section 2350 performs error correction decoding based on the above-described signal stream. To be more specific, error correction decoding section 2350 receives depunctured data 2349 as input. Error correction decoding section 2350 applies error correction decoding the same processing as in error correction decoding section 2318 and outputs iterative decoded data 2351 after error correction decoding.

[Main Processing Delay Time of Demodulation Section]

Figure 14:
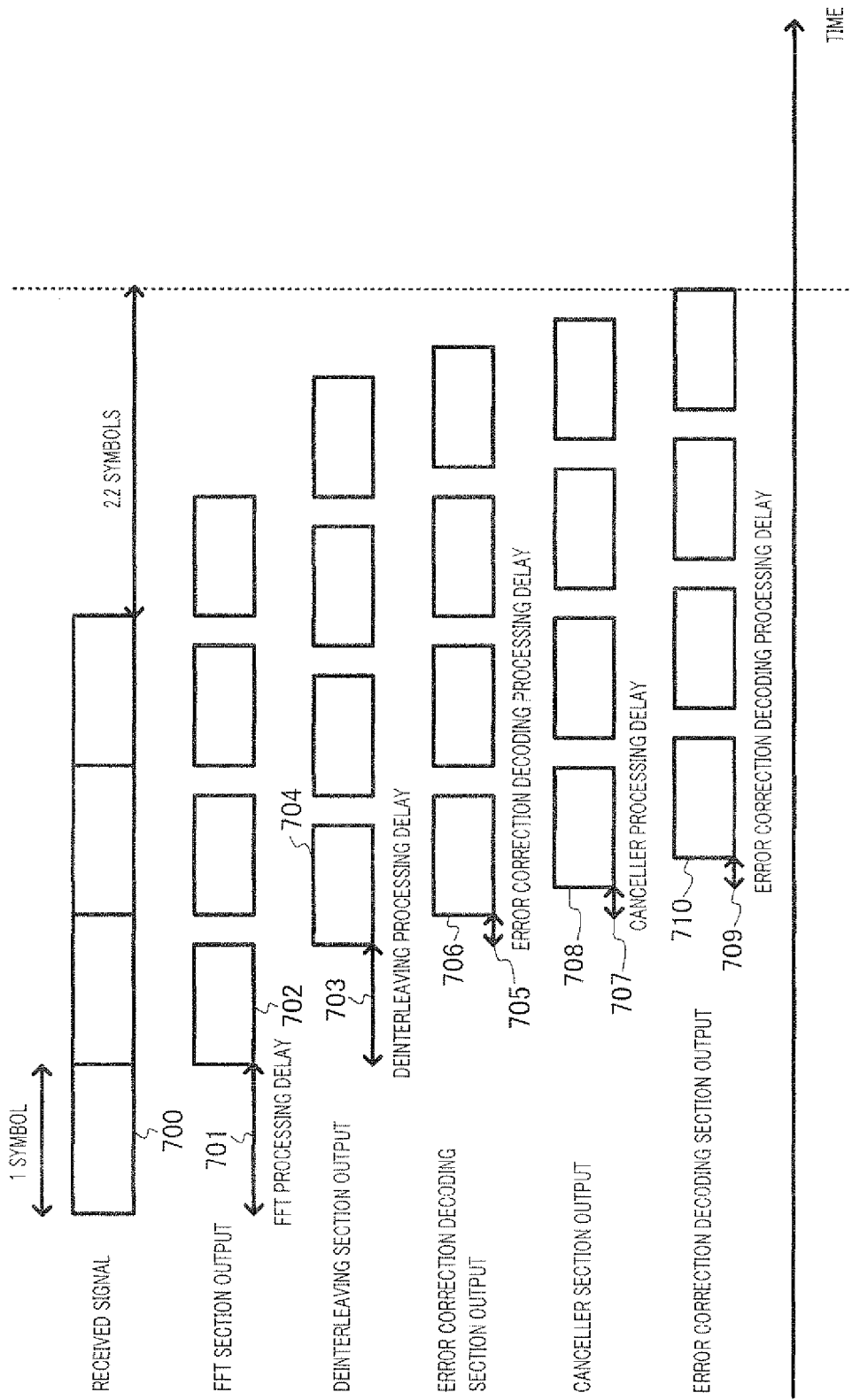
FIG. 14 illustrates main processing delay times in the demodulation section according to Embodiment 1.

Next, main processing delay times at demodulation section 230 shown in FIG. 8 will be explained with reference to FIG. 14. In FIG. 14, the vertical axis shows various types of processing sequentially applied to received data and the horizontal axis shows an elapsed time. Furthermore, the rectangles in FIG. 14 denote data output sections resulting from various processes. Each rectangle in this case expresses data of one OFDM symbol, which is the unit when performing FFT processing. According to FIG. 14, received signal 700 is subjected to FFT processing in FFT sections 2301A and 2301B and converted into subcarrier data, and data 702 after the FFT is outputted. FFT processing requires data to be stored once in units of FFT processing (one OFDM symbol here). This is because all data that is required for butterfly processing of an FFT calculation needs to be supplied beforehand. This originates processing delay time 701, which becomes the unit of FFT processing required to cumulate data. Furthermore, in OFDM modulation, a guard interval is added to a transmission signal to improve the robustness against delay signals. Since this guard interval is removed through FFT processing at the time of demodulation, the number of data with FFT output 702 becomes smaller than received signal 700.

Data 702 after the FFT processing is subjected to signal demultiplexing and demapping and then deinterleaved in deinterleaving section 2312A or 2312B. Deinterleaving section 2312A or 2312B rearranges the interleaved input data sequence according to the rule shown in FIG. 6 in the order of the original data sequence. The deinterleaving processing requires data to be stored in the storage area once to rearrange the order of the data sequence according to the rule shown in FIG. 9. This causes processing delay 703 to be produced from input to output of deinterleaving section 2312A or 2312B. Therefore, deinterleaving section 2312A or 2312B outputs deinterleaved data 704 after processing delay 703.

Next, the first error correction decoding section requires processing delay 705 to decode input data, and outputs output data 706 after processing delay 705. This is a feature of Viterbi decoding, and data of a certain pass memory length generally needs to be stored to obtain a Viterbi decoding result. In the case of an AWGN (Additive White Gaussian Noise) environment, if a pass memory length on the order of five times the constraint length of a normal convolutional coder is adopted, Viterbi decoding can be performed without any deterioration in performance. In the case of convolutional coding of at a constraint length 7 shown in FIG. 4, processing delay on the order of processing delay 705 is produced.

Next, the cancellation section outputs data 708 after the cancellation after processing delay 707. The processing delay produced in the cancellation section is generated through subtraction processing of canceling an interference component from the received signal and combination and calculation processing on the signals of the respective receiving antennas with their interference canceled. The second error correction decoding section outputs decoded data 710 after processing delay 709 in the same way as the first error correction decoding section.

As described above, using channel estimation storage section 2334 and address generation section 2332 allows the order of data with channel estimate value 2335 to be rearranged in accordance with the order of data with mapped modulated signals 2331A and 2331B when a replica is generated. Furthermore, using address generation section 2332 that rearranges the order of output data of FFT sections 2303A and 2303B and signal storage section 2340 allows the order of data with data 2341 after the FFT when interference is canceled to be rearranged in accordance with the order of data with replica signal 2337. This eliminates the necessity for interleaving processing for re-modulation processing of interference cancellation and deinterleaving processing for re-decoding processing. That is, interleaving processing and deinterleaving processing are interrelated such that the order is rearranged through interleaving processing and the rearranged order is restored back to the original order through deinterleaving processing, and therefore by rearranging channel estimate value 2335 and data 2341 after the FFT in accordance with the signal order before the interleaving, it is possible to input data in error correction decoding section 2350 in the right order without performing interleaving processing and deinterleaving processing, thereby shortening the processing delay caused by interleaving processing and deinterleaving processing. This eliminates the necessity for performing interleaving processing for generating a replica of a received signal upon iterative decoding and deinterleaving processing for decoding upon iterative decoding. Therefore, deinterleaving processing delay can be reduced. Thus, the processing delay of the parallel interference canceller can be reduced.

(Embodiment 2)

Figure 15:
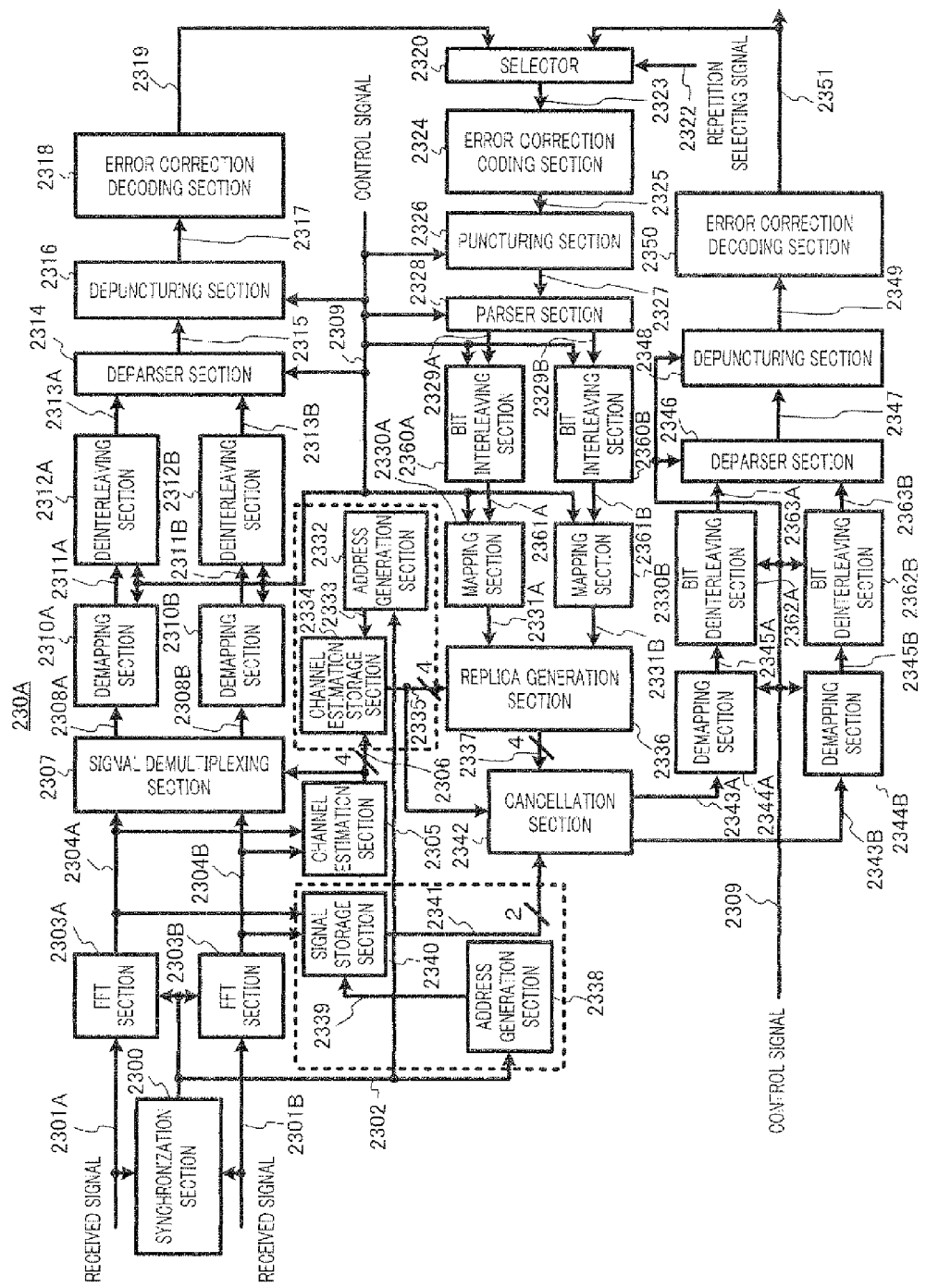
FIG. 15 shows a configuration example of a receiving apparatus according to Embodiment 2 of the present invention.

FIG. 15 illustrates a configuration example of demodulation section 230A of a receiving apparatus according to Embodiment 2 of the present invention. In Embodiment 2, the same parts as in Embodiment 1 are assigned the same reference numerals and overlapping explanations thereof will be omitted. Demodulation section 230A in FIG. 15 includes demodulation section 230 of Embodiment 1 shown in FIG. 8 further provided with two bit interleaving sections 2360A and 2360B and two bit deinterleaving sections 2362A and 2362B. This demodulation section 230A demodulates a received signal and then re-modulates the demodulated data and demultiplexes a MIMO signal using the re-modulated signal. Then, demodulation section 230A uses an iterative decoding scheme that performs re-demodulation. The rest of configuration of the receiving apparatus and transmitting apparatus including the demodulation section is the same as in Embodiment 1. Therefore, the differences from Embodiment 1 will be mainly explained below.

Bit interleaving section 2360A receives as input output data sequence 2329A and control signal 2309 and rearranges the order of an input bit sequence according to control signal 2309. Bit interleaving section 2360A then outputs data sequence 2361A after bit interleaving. Bit interleaving section 2360B also receives parsed output data sequence 2329B and control signal 2309 as input and then applies the same processing as in bit interleaving section 2360A, and outputs data sequence 2361B after bit interleaving. The bit interleaving rearranges the order of bits so as to assign bits in separate storage locations instead of assigning consecutive bit sequences to the same subcarriers.

Bit deinterleaving section 2362A receives as input likelihood 2345A outputted from demapping section 2344A and control signal 2309, rearranges the order of the input bit sequence according to the control signal and outputs bit deinterleaved signal 2364A. Bit deinterleaving section 2362B also performs the same processing as in bit deinterleaving section 2362A, and outputs bit deinterleaved signal 2364B. The bit deinterleaving performs the reverse operation of the aforementioned bit interleaving and performs processing of rearranging data to the data sequence before applying the bit interleaving.

[Interleaving Rule]

Figure 16:
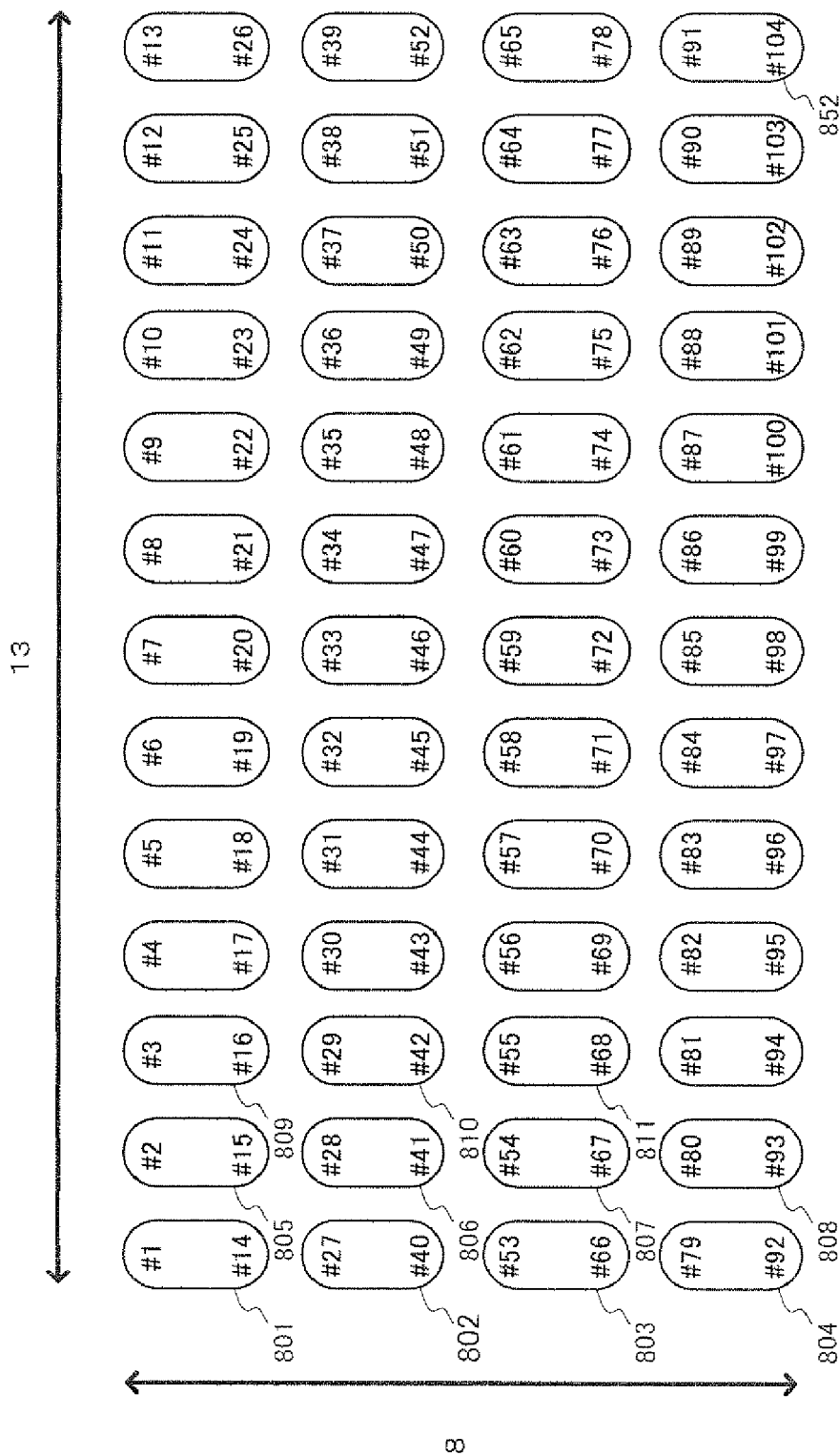
FIG. 16 illustrates an example of the interleaving rule according to Embodiment 2.

Next, the interleaving rule according to Embodiment 2 will be explained with reference to FIG. 16. In FIG. 16, a bit sequence to input is written in the order of #1, #2, #3, . . . , #104, . . . rightward from the top left in FIG. 16 using a storage area of a 13-bit width and 8-bit depth. Each subcarrier (subcarrier 801 made up of a set of #1 and #14 and so on) represents a set of bits mapped to one signal point. On the other hand, in the case of reading, data is read vertically in FIG. 16 in the order of subcarriers 801, 802, 803, 804, 805, . . . , 811, . . . , 852 from the storage area. When the above reading order is expressed in bit representation, data is read in the order of #1, #14, #27, #40, #53, #66, #79, #92, #2, . . . , #78, #91, #104.

According to the rearrangement rule in Embodiment 2, distant bits in a bit sequence received as input are assigned to one subcarrier. For this reason, the bit sequence received as input in the bit interleaving section is converted more randomly than in Embodiment 1. Therefore, when receiving apparatus 200 performs deinterleaving, it is possible to further distribute burst errors that occur in a continuous manner under the influence of fading variations. Therefore, the effects of error correction at receiving apparatus 200 can be more easily achieved.

In the case of 16QAM, a 13-bit wide, 16-bit deep storage area is used, and, in the case of 64QAM, a 13-bit wide, 24-bit deep storage area is used, and writing is performed in the same direction as in the case of QPSK (i.e. rightward from the top left in FIG. 16). Reading is also performed in the same direction as in the case of QPSK (i.e. downward from the top left in FIG. 16).

When the above interleaving rule in FIG. 16 is used, there is a difference in the order of the data sequence between output data 2331A and 2331B of mapping sections 2330A and 2330B and channel estimate value 2335 outputted from channel estimation storage section 2334 in demodulation section 230 in FIG. 8. For this reason, it is difficult for replica generation section 2336 to correctly generate replica signal 2337. Thus, demodulation section 230A in FIG. 15 is provided with bit interleaving sections 2360A and 2360B and performs the following processing. That is, bit interleaving sections 2360A and 2360B match the order of data sequence between output data 2331A and 2331B of mapping sections 2330A and 2330B, and output data 2335 of channel estimation storage section 2334.

Here, channel estimate value 2306 rearranged according to the rule shown in FIG. 12 is expressed by bit indexes. The order is (#1, #14), (#2, #15), (#3, #16), (#4, #17), (#5, #18), (#6, #19), (#7, #20), (#8, #21), (#9, #22), (#10, #23), (#11, #24), (#12, #25), (#13, #26), (#27, #40), (#28, #41), . . . , (#91, #104). Each set of bits indicated by numbers in parentheses means that the bits are assigned to the same subcarrier. Thus, bit interleaving sections 2360A and 2360B rearrange mapped data 2331A and 2331B re-modulated so as to be in the same order as channel estimate value 3435 outputted from channel estimation storage section 2334.

[Rearrangement Rule of Bit Interleaving Section]

Next, the rearrangement rule in the bit interleaving section will be explained with reference to FIG. 17. Here, suppose the QPSK modulation scheme will be used. The bit interleaving section performs writing and reading using a storage area of, for example, a width of 13 bits and a depth of 8 bits, shown in FIG. 17. For example, the bit sequence to input is written rightward from the top left in FIG. 17 in the order of #1, #2, #3, . . . , #104, . . . . When bits #1 to #26 are written, subcarriers 901, 902, 903, 904, 905, . . . , 913 are read in that order from the storage area. The above-described read bit sequence is rearranged into an order of (#1, #14), (#2, #15), (#3, #16), (#4, #17), (#5, #18), (#6, #19), (#7, #20), (#8, #21), (#9, #22), (#10, #23), (#11, #24), (#12, #25), (#13, #26), (#27, #40), (#28, #41), . . . , (#91, #104).

Figure 17:
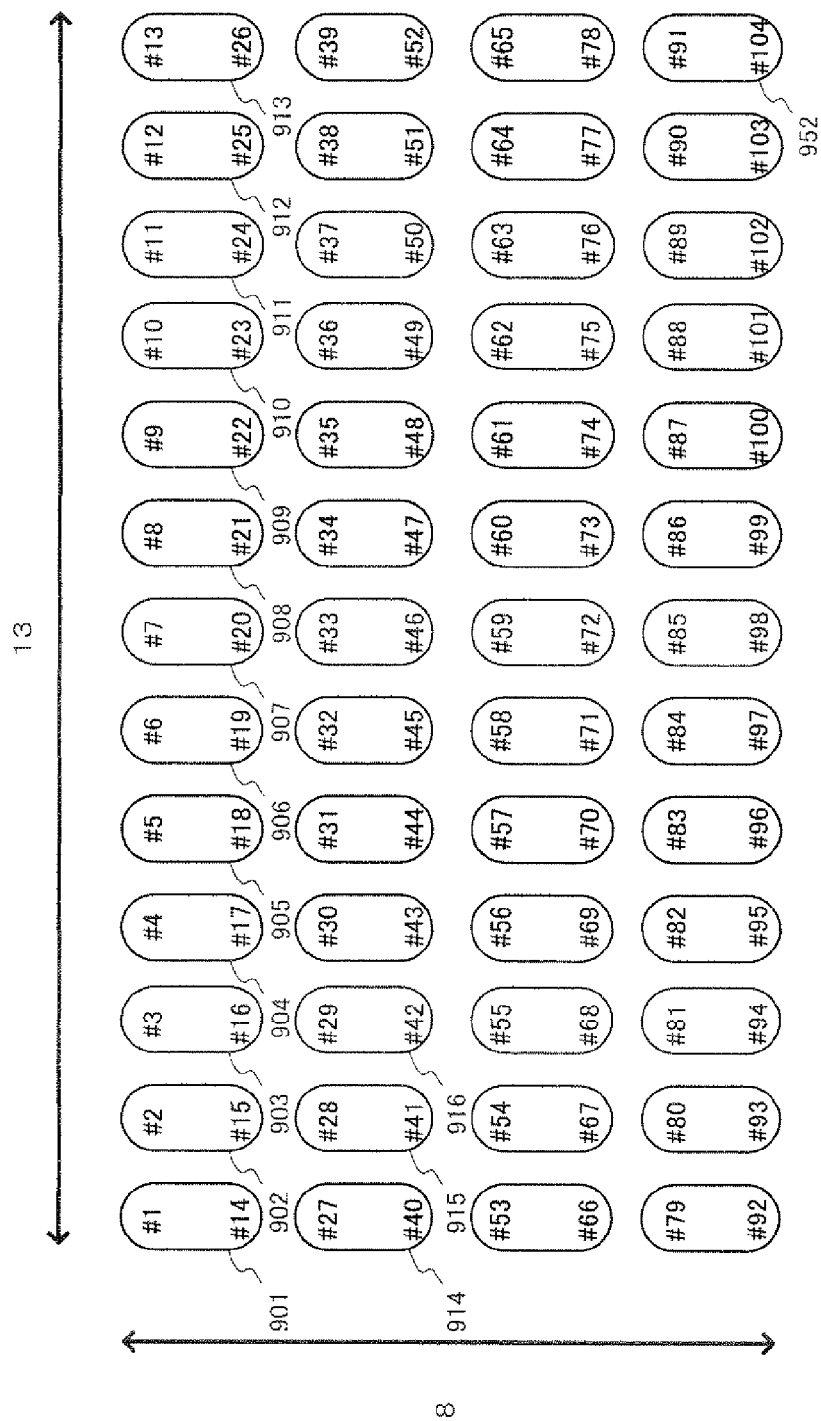
FIG. 17 illustrates an example of the bit interleaving rule according to Embodiment 2.

In the bit interleaving of Embodiment 2, if 26 bits #1 to #26 in FIG. 17 are cumulated in the storage area of the bit interleaving section, subcarriers 901 to 913 in subcarrier diagram FIG. 17 can be outputted. That is, if 1/4 OFDM symbol data is cumulated, the data can be read. Thus, the bit interleaving processing of Embodiment 2 can shorten the processing delay more than normal interleaving processing (which must cumulate 104 bits).

In FIG. 17, a case has been explained where bit interleaving sections 2360A and 2360B adopt the QPSK modulation scheme, but the present invention may also adopt other modulation schemes such as BPSK, 16QAM and 64QAM. In the case of the modulation scheme of BPSK, the demodulation section of Embodiment 2 can include the same components as in the demodulation section of Embodiment 1 without bit interleaving sections 2360A and 2360B.

In the case of the modulation scheme of 16QAM, the bit interleaving section performs writing following the same procedure as shown in FIG. 17 using a storage area of a width of 13 bits and a depth of 16 bits. The bit interleaving section then reads subcarriers after writing of four columns of bits (i.e. a width of 4 bits) is finished. The bit interleaving section then repeats writing and reading for the four columns up to the final bit.

In the case of the modulation scheme of 64QAM, the bit interleaving section performs writing following the same procedure as shown in FIG. 17 using a storage area of a width of 13 bits and a depth of 24 bits. The bit interleaving section then reads subcarriers after writing of six columns of bits (i.e. a width of 6 bits) is finished. The bit interleaving section then repeats writing and reading for the six columns up to the final bit.

[Rearrangement Rule in Bit Deinterleaving Section]

Next, the rearrangement rule in bit deinterleaving sections 2362A and 2362B will be explained with reference to FIG. 17. Bit deinterleaving sections 2362A and 2362B perform the reverse processing of the interleaving processing in FIG. 16. Bit deinterleaving sections 2362A and 2362B then rearrange the data back to the original bit sequence.

When writing, bit deinterleaving sections 2362A and 2362B write data into subcarriers 901, 902, 903, 904, 905, . . . , 913 in that order, in FIG. 17. Bit deinterleaving sections 2362A and 2362B also write the following rows up to subcarrier 952 in the same way. When writing is finished up to subcarrier 913, bit deinterleaving sections 2362A and 2362B read bits in the order of #1, #2, #3, . . . , #26. Likewise, when writing of the next row is finished, bit deinterleaving sections 2362A and 2362B repeat the procedure until bit #104 is read. That is to say, when writing of one column of subcarriers is performed, bit deinterleaving sections 2362A and 2362B can read bits. Thus, since reading is possible when 1/4 OFDM symbol data is cumulated, the processing delay can be reduced compared to normal deinterleaving processing (which must perform read processing after all data has been stored).

In FIG. 17, a case with the QPSK modulation scheme has been explained, but the present invention may also adopt other modulation schemes such as BPSK, 16QAM or 64QAM. In the case of the modulation scheme of BPSK, the demodulation section of Embodiment 2 needs no bit deinterleaving sections 2362A and 2362B as in the case of Embodiment 1.

In the case of the modulation scheme of 16QAM, the bit deinterleaving section performs writing using a 13-bit wide, 16-bit deep storage area following the same procedures as the above-described rearrangement rule in bit deinterleaving sections 2362A and 2362B. After having finished writing for one column of subcarriers, the bit deinterleaving section reads four columns of bits. The bit deinterleaving section then repeats writing and reading for the above four columns, up to the final bit.

In the case of the modulation scheme of 64QAM, the bit deinterleaving section performs writing using a storage area of a width of 13 and a depth of 24 following the same procedure as the rearrangement rule in the above-described bit deinterleaving section. After having finished writing for one column of subcarriers, the bit deinterleaving section reads six columns of bits. The bit deinterleaving section then may repeat writing and reading for the above six columns, up to the final bit.

[Main Processing Delay Times of Demodulation Section]

Figure 18:
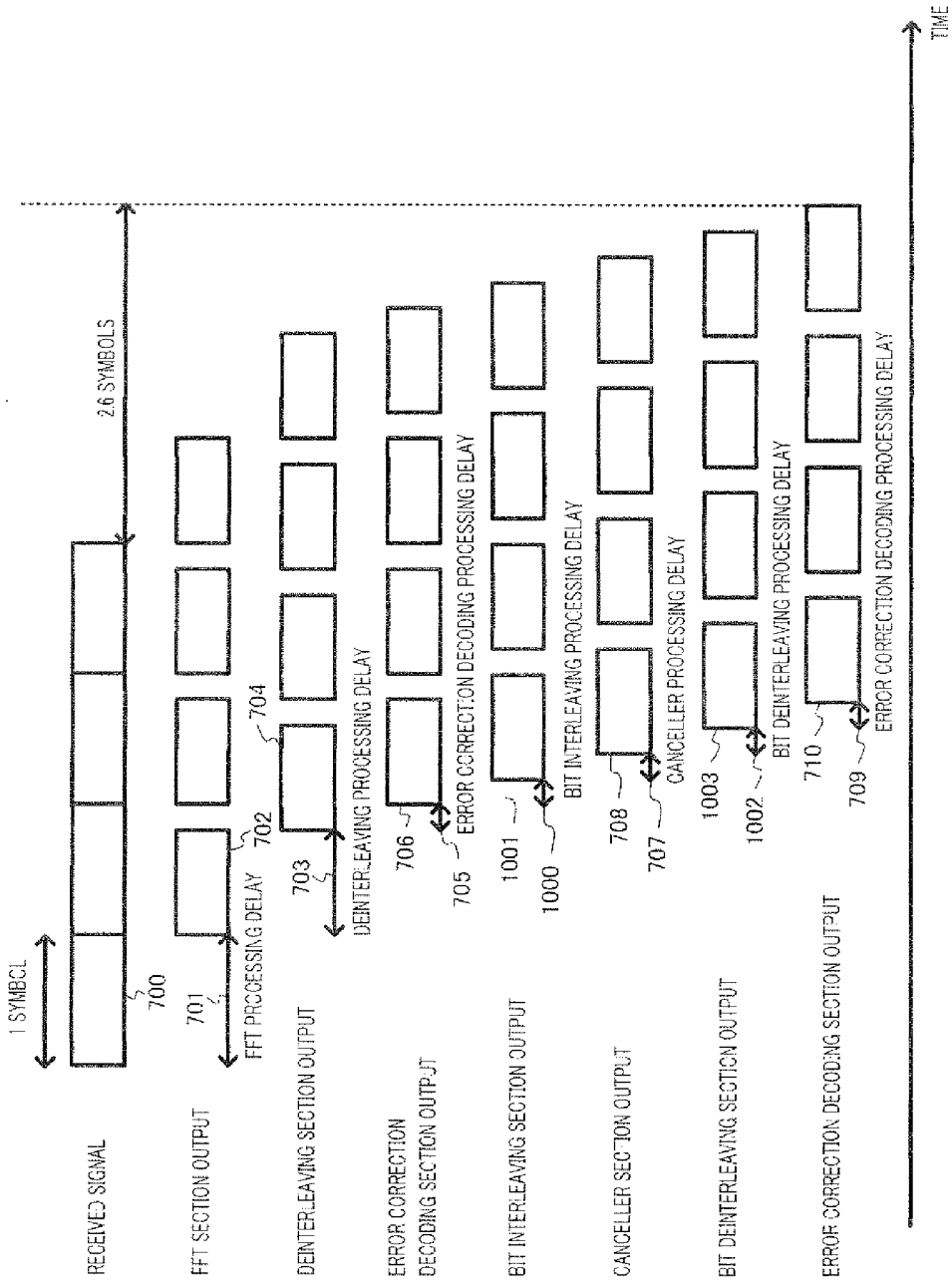
FIG. 18 illustrates processing delay times according to Embodiment 2.

Next, main processing delay times in demodulation section 230A shown in FIG. 15 will be explained with reference to FIG. 18. Unlike the case illustrated in FIG. 14, as for the processing delay times in FIG. 18, the processing delay in the bit interleaving section and bit deinterleaving section are further produced. The rest of processing delay times are the same as shown in FIG. 14. Thus, the processing delay in the bit interleaving section and bit deinterleaving section will be mainly explained. According to FIG. 18, the bit interleaving section outputs data 1001, processing delay time 1000 after having received data as input. This processing delay time 1000 corresponds to a 1/4 symbol. This is because the bit interleaving section can output data if a 1/4 symbol of data, not all bits, is cumulated. The bit deinterleaving section outputs data 1003 processing delay time 1002 after having received data as input. This processing delay time 1002 also corresponds to a 1/4 symbol. This is because the bit deinterleaving section can also output data if a 1/4 symbol of data, not all bits, is cumulated.

As shown above, upon receiving a signal subjected to interleaving processing on the transmitting side according to the rule shown in FIG. 16, the rule in address generation section 2338 for rearranging the order of the received signal shown in FIG. 15, signal storage section 2340, address generation section 2332, channel estimation storage section 2334, bit interleaving sections 2360A and 2360B, and bit deinterleaving sections 2362A and 2362B allows the interleaving processing and deinterleaving processing upon iterative decoding to be performed according to the rule shown in FIG. 17. Thus, it is possible to reduce the processing delay time to 1/4 compared to the conventional processing delay time necessary for interleaving processing and deinterleaving processing upon iterative decoding, and as a result, it is possible to shorten the processing time after receiving a signal until a signal subjected to error correction decoding outputted from error correction decoding section 2350 is obtained compared to the prior art. Furthermore, since the processing delay of iterative decoding is shortened, when the number of iterations is increased, the effect of shortening the processing delay time improves.

(Embodiment 3)

In Embodiment 3, unlike Embodiment 2, the rearrangement rule in the interleaving section on the transmitting side differs among MIMO streams. Therefore, the differences from Embodiment 2 will be mainly explained below.

[Rearrangement Rule of Interleaving Section]

Figure 19:
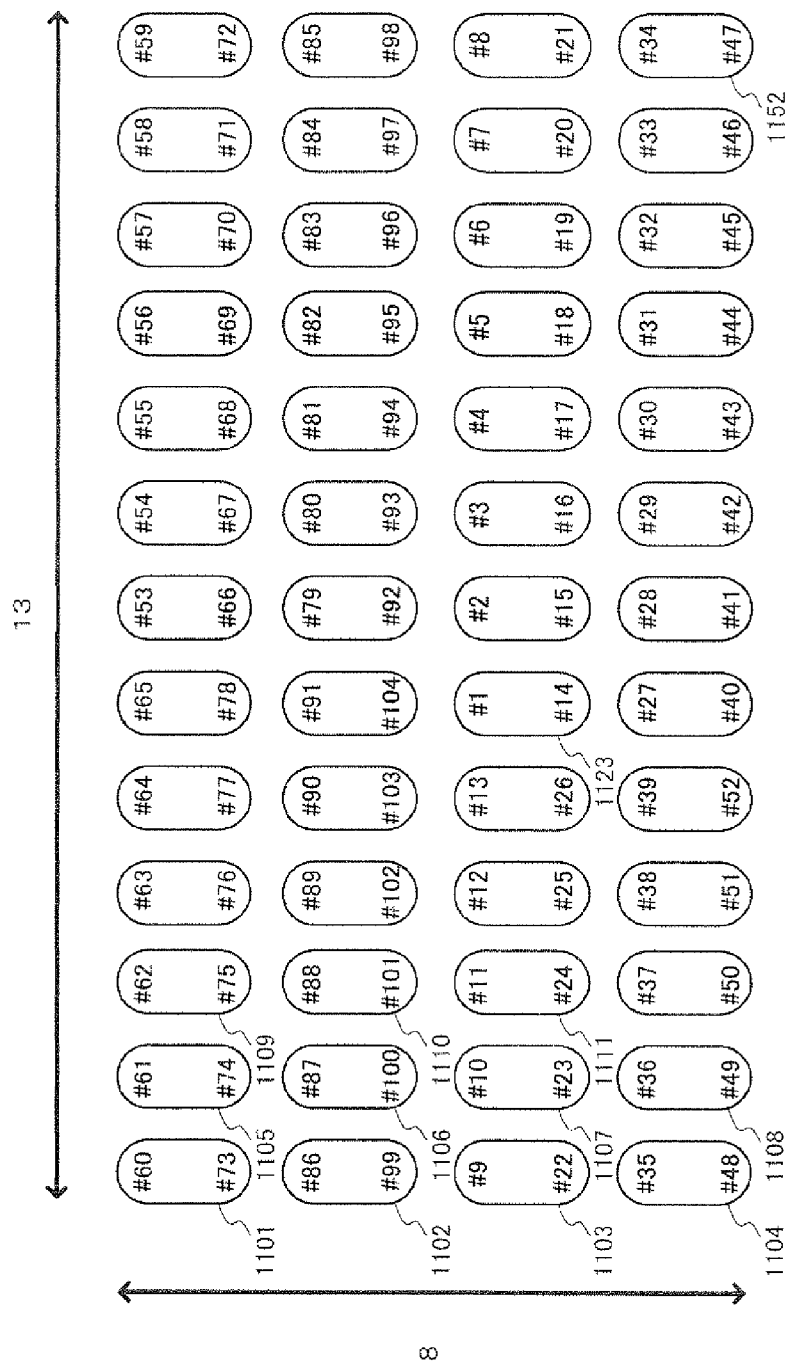
FIG. 19 illustrates an example of the interleaving rule according to Embodiment 3 of the present invention.

First, the rearrangement rule in interleaving section 114B according to Embodiment 3 will be explained with reference to FIG. 19. Here, suppose the QPSK modulation scheme is used as an example. Interleaving section 114B performs writing and reading using a storage area of, for example, a width of 13 bits and a depth of 8 bits, shown in FIG. 19. To be more specific, interleaving section 11413 writes input bits rightward from subcarrier 1123 in the order of #1, #2, #3, . . . , #104. That is, writing is started from some midpoint of the storage area of a width of 13 bits and a depth of 8 bits. Interleaving section 114B then reads the next written data in the order of subcarriers 1101, 1102, 1103, 1104, 1105, 1106, . . . , 1152 from the above storage area. Thus, rearranging the order using different rules between interleaving sections 114A and 114B makes it possible to further distribute burst errors due to fading variations compared to using the same rule, and makes it easier to achieve the effect of error correction.

[Configuration of Demodulation Section]

Figure 20:
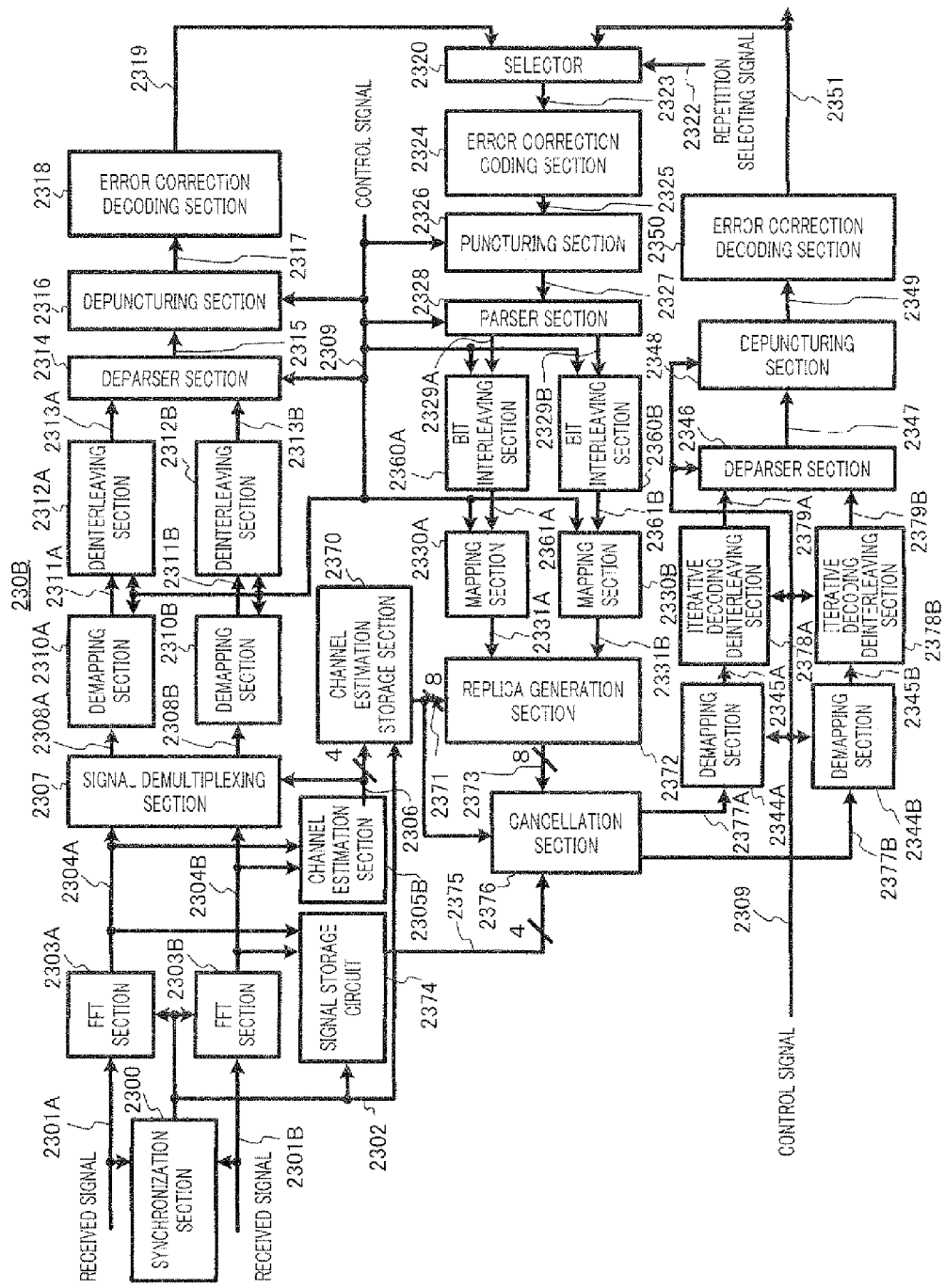
FIG. 20 shows a configuration example of a receiving apparatus according to Embodiment 3.

FIG. 20 shows a configuration example of demodulation section 230B of the receiving apparatus according to Embodiment 3 of the present invention. In Embodiment 3, the same parts as in Embodiment 2 will be assigned the same reference numerals and overlapping explanations will be omitted as appropriate. Demodulation section 230B in FIG. 20 has channel estimation storage circuit 2370, instead of address generation section 2332 and channel estimation storage section 2334 in demodulation section 230A shown in FIG. 15. Furthermore, demodulation section 230B has signal storage circuit 2374, instead of address generation section 2338 and signal storage section 2340 in demodulation section 230A shown in FIG. 15. Furthermore, demodulation section 230B has replica generation section 2372 and cancellation section 2376, instead of replica generation section 2336 and cancellation section 2342 in demodulation section 230A shown in FIG. 15 and further has iterative decoding deinterleaving sections 2378A and 2378B.

Deinterleaving section 2312B in FIG. 20 performs writing and reading according to a different rearrangement rule from deinterleaving section 2312A in FIG. 20. Deinterleaving section 2312A in FIG. 20 performs writing and reading according to the same rearrangement rule as in deinterleaving section 2312A in FIG. 15.

The rearrangement rule in deinterleaving section 2312B in FIG. 20 will be explained with reference to FIG. 19 again. Here, suppose the modulation scheme of QPSK is adopted. Deinterleaving section 2312B in FIG. 20 performs writing and reading using a storage area of, for example, a width of 13 bits and a depth of 8 bits, shown in FIG. 19. To be more specific, deinterleaving section 2312B writes input data vertically in FIG. 19 in the order of subcarriers 1101, 1102, 1103, 1104, 1105, 1106, . . . , 1152. Next deinterleaving section 2312B then reads the written data horizontally in FIG. 19 from subcarrier 1123 in the order of #1, #2, #3, #4, #5, #6, #7, #8, #9, #10, #11, . . . , #104. Thus, reading data from a midpoint in the storage area allows data rearranged by interleaving section 114B to be rearranged back to the original data sequence.

Channel estimation storage circuit 2370 receives as input channel estimate value 2306 outputted from channel estimation section 2305 and timing signal 2302 outputted from synchronization section 2300, and writes or reads channel estimate value 2306 in response to the input of timing signal 2302. Channel estimation storage circuit 2370 outputs read channel estimate value 2371 (2306).

[Configuration of Channel Estimation Storage Circuit]

Figure 21:
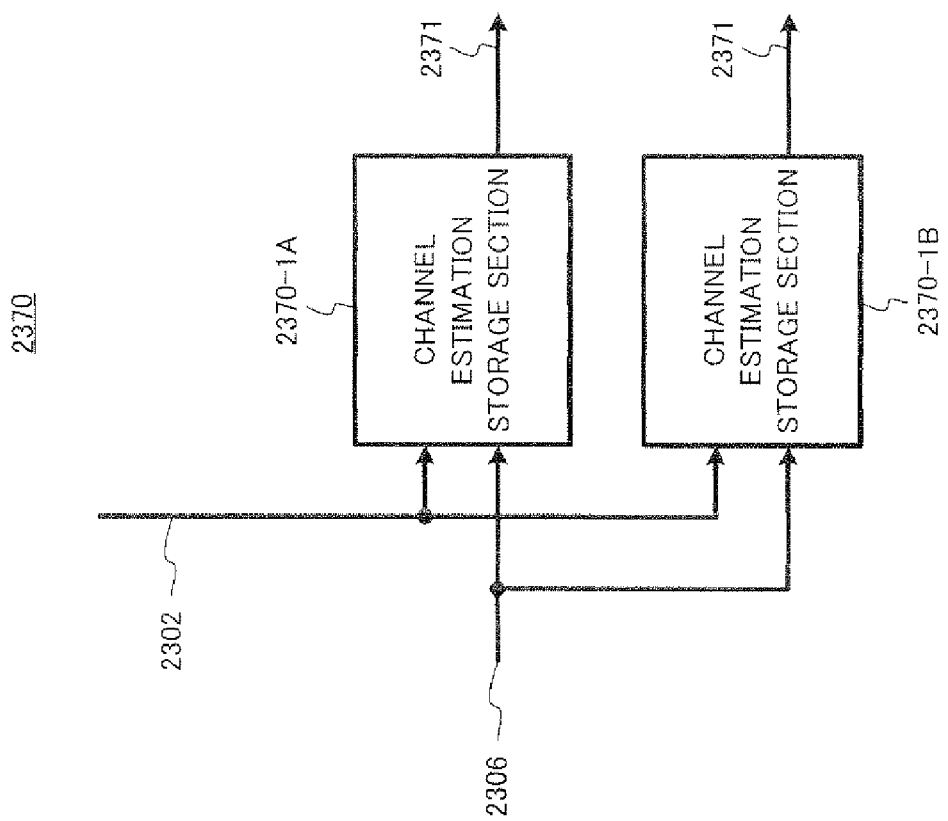
FIG. 21 shows a configuration example of the channel estimation storage circuit.

FIG. 21 illustrates a configuration example of channel estimation storage circuit 2370. Channel estimation storage circuit 2370 in FIG. 21 has two channel estimation storage sections 2370-1A and 2370-1B. Channel estimation storage section 2370-1A receives as input channel estimate value 2306 and timing signal 2302 and writes or reads channel estimate value 2306 into/from a predetermined storage area. Channel estimation storage section 2370-1A then outputs read channel estimate value 2371 (2306). The internal configuration of channel estimation storage section 2370-1A can also include the components shown in FIG. 10. Channel estimate value storage section 2370-1B also performs the same processing as in channel estimation storage section 2370-1A, and outputs channel estimate value 2371 (2306).

Adopting the configuration including each channel estimation storage circuit 2370 as shown in FIG. 21 allows different rules to be set in two channel estimation storage sections 2370-1A and 2370-1B (address conversion table). Therefore, two types of data, rearranged in different orders, can be outputted.

For example, when channel estimate value 2306 to input in channel estimation storage circuit 2370 is $h_{11}'$, $h_{12}'$, $h_{21}'$, $h_{22}'$, channel estimation storage section 2370-1A outputs a data sequence of $h_{11pt1}'$, $h_{12pt1}'$, $h_{21pt1}'$ and $h_{22pt1}'$. Furthermore, channel estimation storage section 2370-1B outputs a data sequence of $h_{11pt2}'$, $h_{12pt2}'$, $h_{21pt2}'$ and $h_{22pt2}'$.

Suppose the address conversion table (not shown) of channel estimation storage section 2370-1A adopts the same rule as described in Embodiment 2. Next, the rearrangement rule in channel estimation storage section 2370-1B will be explained with reference to FIG. 22.

Figure 22:
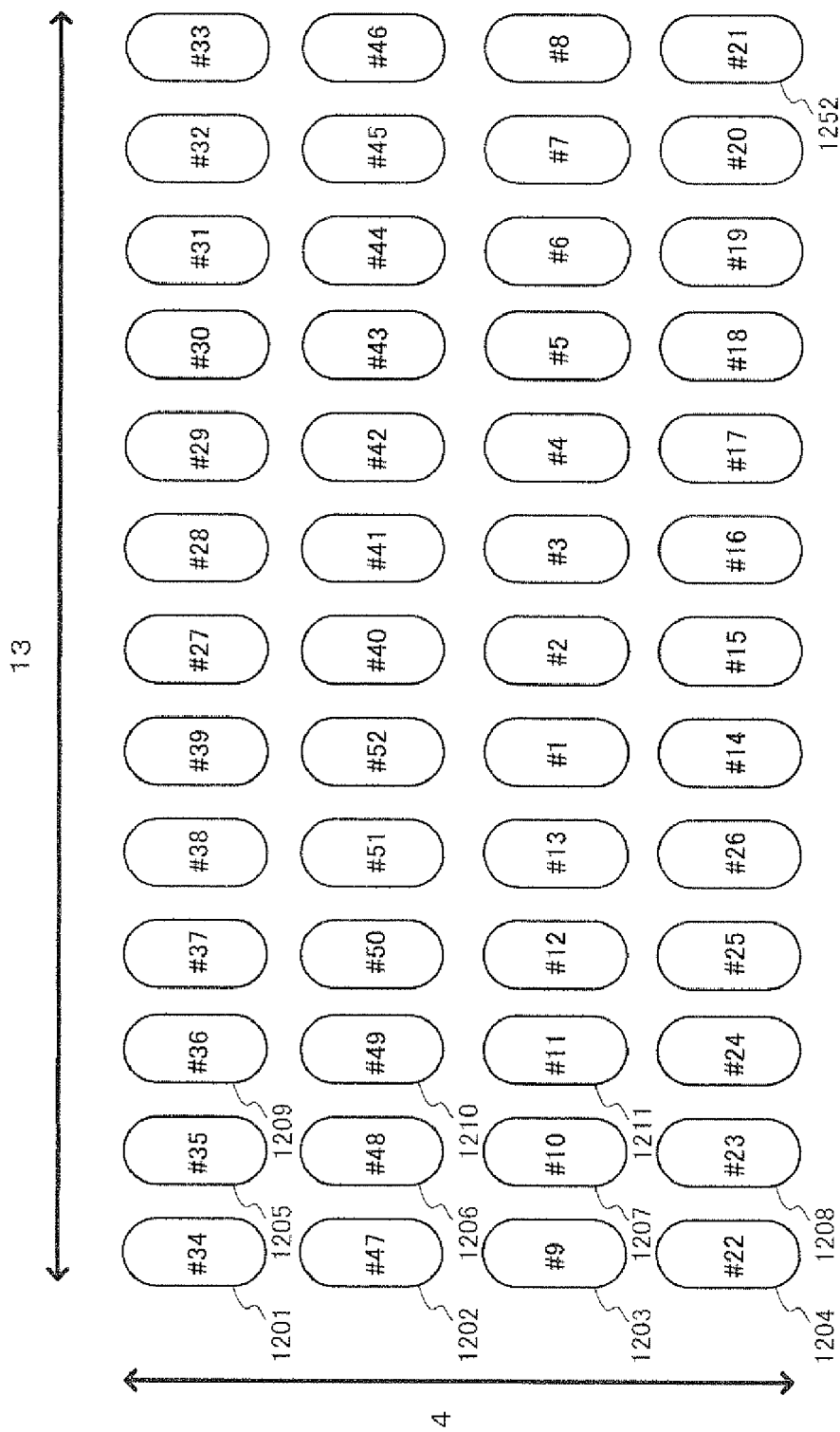
FIG. 22 illustrates an example of the symbol deinterleaving rule according to Embodiment 3.

Channel estimation storage section 2370-1B performs writing and reading using a storage area of, for example, a 13-bit width and a 4-bit depth shown in FIG. 22. To be more specific, channel estimation storage section 2370-1B writes data to input vertically in FIG. 22 from subcarrier 1201 up to subcarrier 1252 in the order of subcarriers 1202, 1203, 1204, 1205, 1206, . . . , 1252. Channel estimation storage section 2370-1B then reads the written data horizontally in FIG. 22 in the order of bits #1, #2, #3, . . . , #104. Adopting the rule for reading data from some midpoint of the storage area in this way allows channel estimation storage section 2370-1B to output a channel estimation signal according to the order of data with the re-modulated signal outputted from FFT section 2303B.

Referring back to FIG. 20, replica generation section 2372 receives as input mapped data 2331A and 2331B, and channel estimate value 2371. Replica generation section 2372 then multiplies the mapped data by a channel estimate value, generates replica signal 2373 and outputs replica signal 2373. Replica generation section 2372 multiplies channel estimate values $h_{11pt1}'$ and $h_{12pt1}'$ by $s_1'$, which is mapping data 2331A, and generates $h_{11pt1}'s_1'$ and $h_{12pt1}'s_1'$. Replica generation section 2372 then multiplies channel estimate values $h_{21pt2}'$ and $h_{22pt2}'$, and $s_2'$, which is mapping data 2331B, and generates $h_{21pt2}'s_2'$ and $h_{22pt2}'s_2'$.

Signal storage circuit 2374 receives as input OFDM demodulated signals 2304A and 2304B, and timing signal 2302 outputted from synchronization section 2300. Signal storage circuit 2374 writes or reads an OFDM signal in response to the input of timing signal 2302. Signal storage circuit 2374 then outputs the read OFDM demodulated signal.

[Configuration of Signal Storage Circuit]

Figure 23:
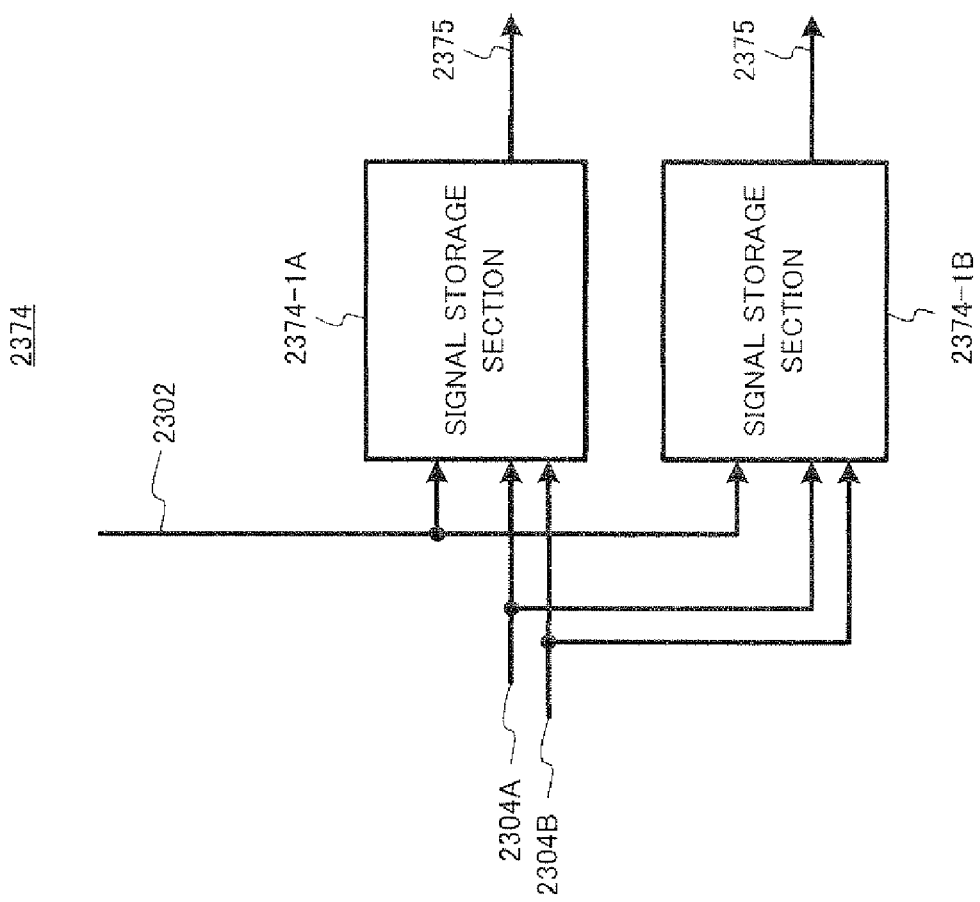
FIG. 23 shows a configuration example of the signal storage circuit.

FIG. 23 shows a configuration example of signal storage circuit 2374. Signal storage circuit 2374 has two signal storage sections 2374-1A and 2374-1B. Signal storage section 2374-1A receives as input OFDM demodulated signals 2304A and 2304B, and timing signal 2302. Signal storage section 2374-1A writes and reads the OFDM demodulated signal in response to the input of timing signal 2302. Signal storage section 2374-1A then outputs the read OFDM demodulated signal. Signal storage section 2374-1B also includes the same components as in signal storage section 2374-1A and carries out the same processing as in signal storage section 2374-1A.

Signal storage sections 2374-1A and 2374-1B can include the same components as in FIG. 13. In FIG. 23, since two signal storage sections 2374-1A and 2374-1B are arranged, the respective address conversion tables (see FIG. 13) may store different reading rules. The above different reading rules allow an OFDM demodulated signal to be rearranged in two different data sequences.

For example, signal storage section 2374-1A outputs OFDM demodulated signals $r_{1pt1}$ and $r_{2pt1}$ according to the same rearrangement rule as in Embodiment 1. On the other hand, signal storage section 2374-1B outputs $r_{1pt1}$ and $r_{2pt1}$ according to the rule shown in FIG. 22 (the same rule as in channel estimation storage section 2370-1B).

Cancellation section 2376 in FIG. 20 receives as input replica signal 2373, channel estimate value 2371 and OFDM demodulated signal 2375. Cancellation section 2376 then subtracts a replica signal from OFDM demodulated signal 2375 and extracts a streaming signal having had the interference signal removed. Furthermore, cancellation section 2376 combines signal streams of the respective receiving antennas using channel estimate value 2371 and in consideration of phase and amplitude, and outputs signal streams 2377A and 2377B.

Signal stream 2377A is obtained as follows. First, $r_{1st1}$ is obtained by subtracting $h_{12pt2}'s_2'$ from OFDM demodulated signal $r_{1pt2}$. Furthermore, $r_{2st1}$ is obtained by subtracted $h_{22pt2}'s_2'$ from OFDM demodulated signal $r_{2pt2}$. Signal stream 2377A is then obtained by combining $r_{1st1}$ and $r_{2st1}$ using channel estimate values $h_{11pt2}'$ and $h_{21pt2}'$ and in consideration of phase and amplitude. Signal stream 2377B is obtained as follows. First, $r_{1st2}$ is obtained by subtracting $h_{11pt1}'s_1'$ from OFDM demodulated signal $r_{1pt1}$. Furthermore, $r_{2st2}$ is obtained by subtracting $h_{21pt1}'s_1'$ from OFDM demodulated signal $r_{2pt1}$. Signal stream 2377B is then obtained by combining $r_{1st2}$ and $r_{2st2}$ using channel estimate values $h_{12pt1}'$ and $h_{22pt1}'$, and in consideration of phase and amplitude.

Iterative decoding deinterleaving section 2378A receives as input likelihood 2345A and performs rearrangement processing on the input data. Iterative decoding deinterleaving section 2378A then outputs deinterleaved data 2379A. Iterative decoding deinterleaving section 2378B receives as input likelihood 2345B and performs rearrangement processing on the input data. Iterative decoding deinterleaving section 2378B then outputs deinterleaved data 2379B.

[Rearrangement Rule of Iterative Decoding Deinterleaving Section]

Figure 24:
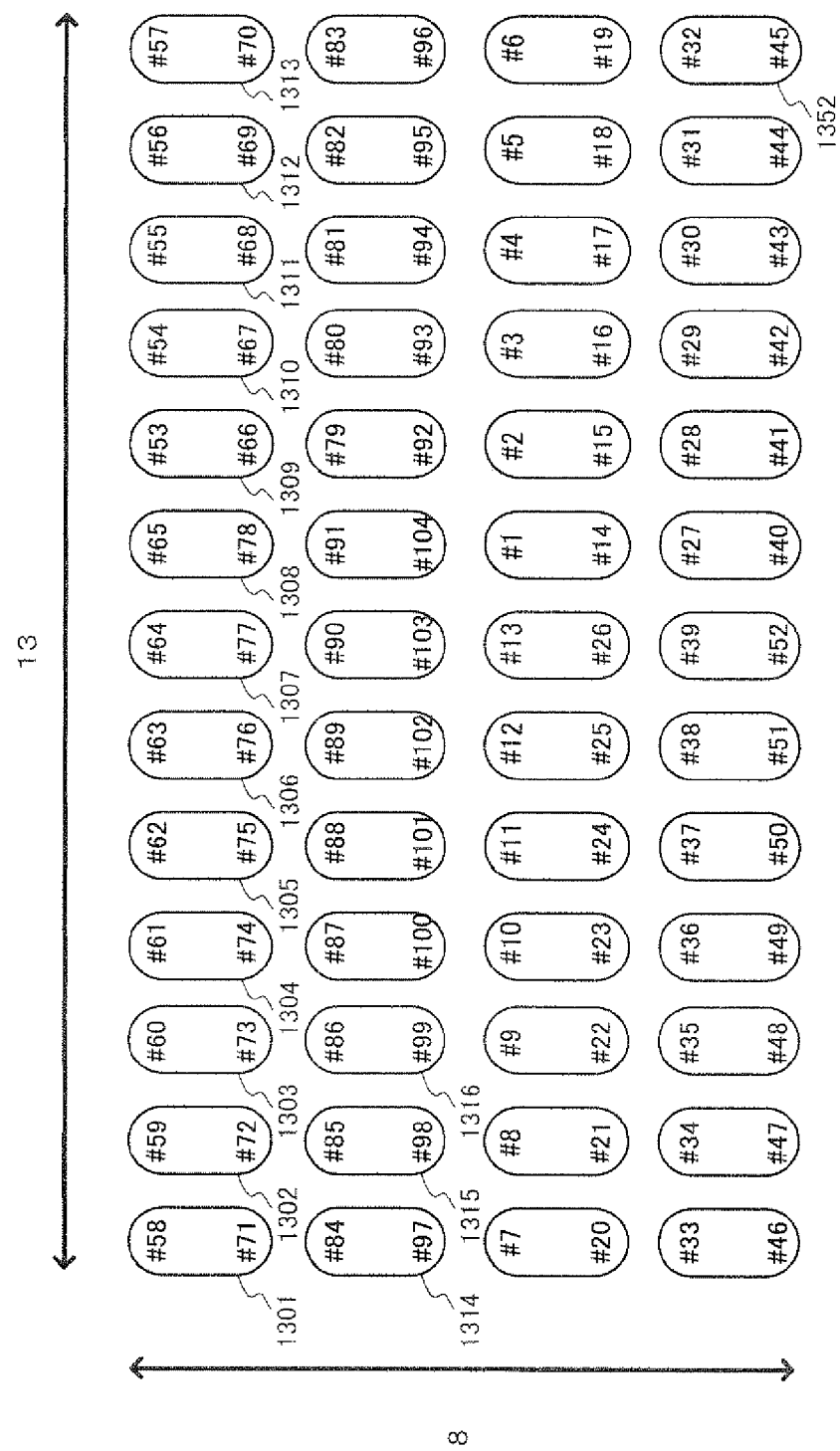
FIG. 24 illustrates one part of an iterative decoding deinterleaving rule according to Embodiment 3.

Next, the rearrangement rule in iterative decoding deinterleaving section 2378A (i.e. the iterative decoding deinterleaving rule) will be explained with reference to FIG. 24. Here, suppose the modulation scheme is QPSK. Iterative decoding deinterleaving section 2378A performs writing and reading using a storage area of, for example, a width of 13 bits and a depth of 8 bits shown in FIG. 24. To be more specific, iterative decoding deinterleaving section 2378A writes input data in the order of subcarriers 1301, 1302, 1303, 1304, 1305, 1306, 1307, 1308, 1309, 1310, 1311, 1312 and 1313. Iterative decoding deinterleaving section 2378A then writes input data into subcarriers 1314, . . . on the next column (in the width direction) likewise and then writes input data up to subcarrier 1352. Iterative decoding deinterleaving section 2378A extracts the written data in the order of bits #1, #2, #3, . . . , #104. By reading the above rule, it is possible to rearrange the data sequence of signal stream 2377A after interference cancellation in the same order as the deinterleaved data sequence 2313A. That is, in order to shorten the processing time necessary for interleaving processing of re-modulation, bit interleaving section 2360A performs rearrangement using a different rule from the rule in interleaving section 114A on the transmitting side. Iterative decoding deinterleaving section 2378A reads the data sequence from the above subcarrier at a midpoint in iterative decoding, and can thereby rearrange the data sequence rearranged according to different a rule from the rule in interleaving section 114A in the same order as the order of the data sequence before being subjected to interleaving processing on the transmitting side.

Figure 25:
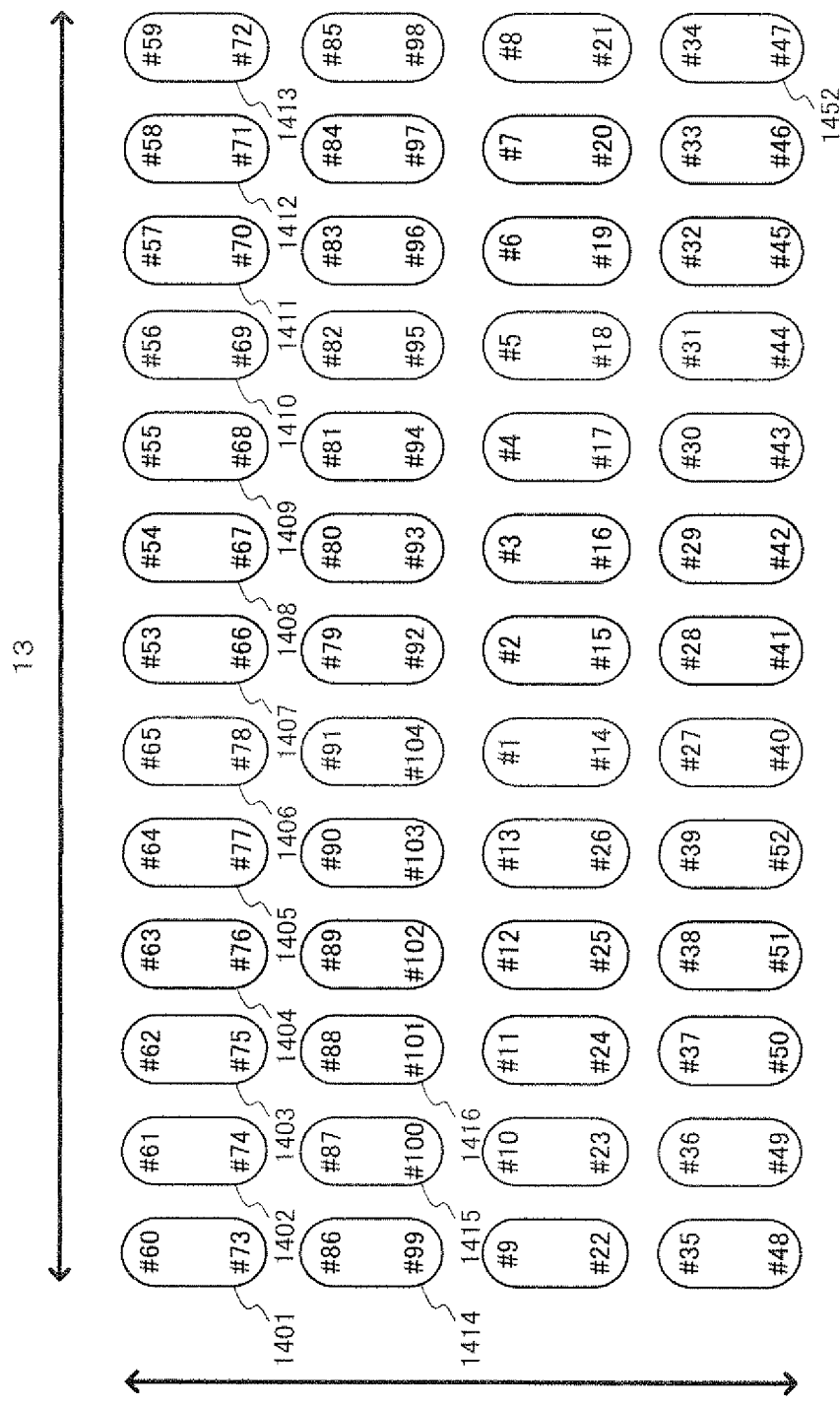
FIG. 25 illustrates the other part of the iterative decoding deinterleaving rule according to Embodiment 3.

Next, the rearrangement rule in iterative decoding deinterleaving section 2378B will be explained with reference to FIG. 25. Here, suppose the modulation scheme is QPSK, too. Iterative decoding deinterleaving section 2378B performs writing and reading using a storage area of, for example, a width of 13 bits and a depth of 8 bits shown in FIG. 25.

To be more specific, iterative decoding deinterleaving section 2378B writes input data in the order of subcarriers 1401, 1402, 1403, 1404, 1405, 1406, 1407, 1408, 1409, 1410, 1411, 1412 and 1413. Iterative decoding deinterleaving section 2378B then writes the next column (in the width direction) into subcarriers 1414, . . . , likewise, and then writes input data up to subcarrier 1452. Iterative decoding deinterleaving section 2378B extracts the written data in the order of bits #1, #2, #3, . . . , #104. By reading the data according to the above rule, it is possible to rearrange the data sequence of signal stream 2377B after interference cancellation in the same order as the deinterleaved data sequence 2313B. That is, in order to shorten the processing time necessary for interleaving processing of re-modulation, bit interleaving section 2360B performs rearrangement according to different a rule from the rule in interleaving section 114E on the transmitting side. Iterative decoding deinterleaving section 2378B reads the data sequence from the above subcarrier at a midpoint in iterative decoding, and can thereby rearrange the data sequence rearranged according to different a rule from the rule in interleaving section 114B in the same order as the order of the data sequence before being subjected to interleaving processing on the transmitting side.

Through the above rearrangement of bits, iterative decoding deinterleaving sections 2378A and 2378B rearrange data in the same order as the order of the input data of interleaving sections 114A and 114B of transmitting apparatus 100.

[Main Processing Delay Times of Demodulation Section]

Figure 1:
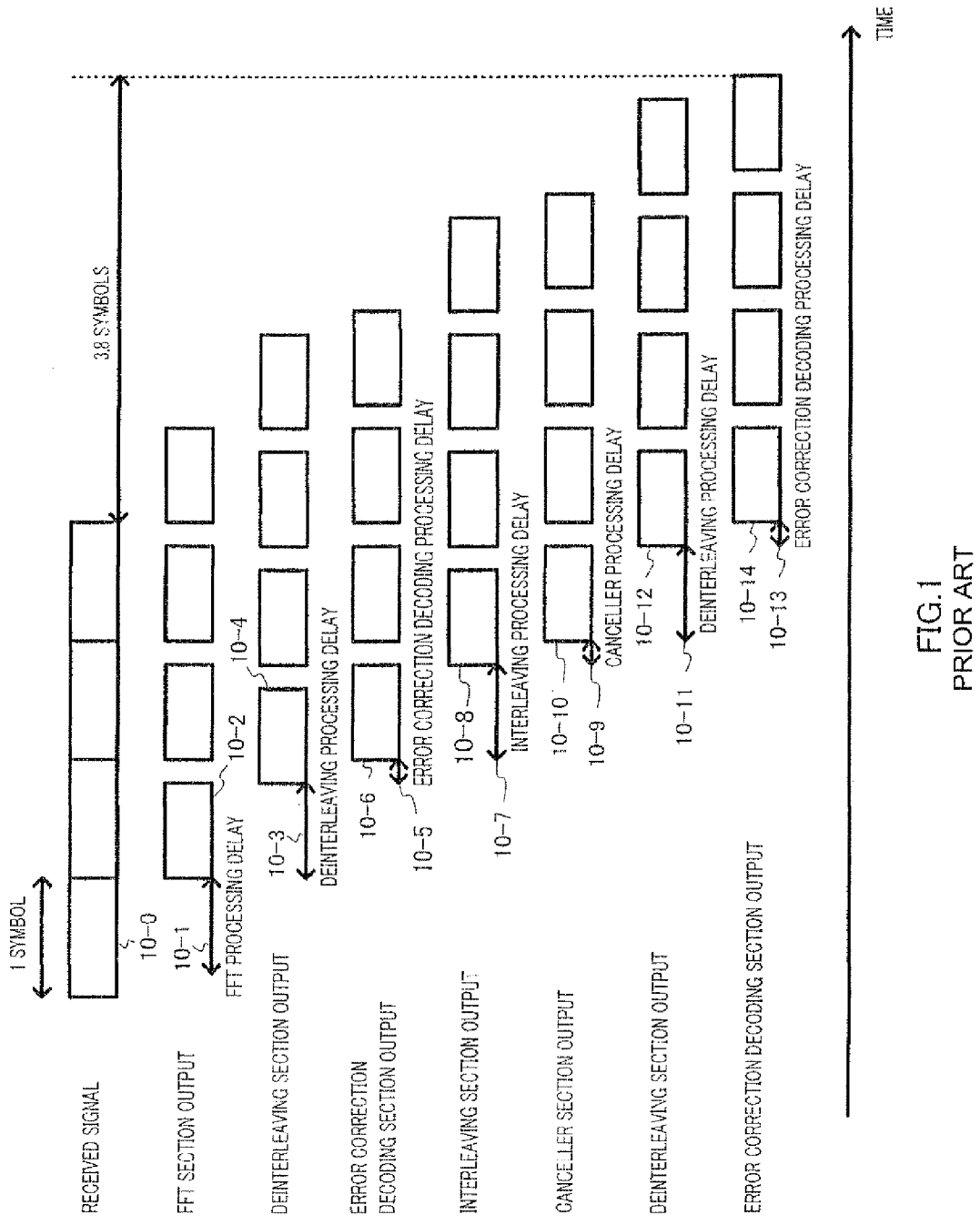
FIG. 1 illustrates processing delay times in a prior art.
Figure 26:
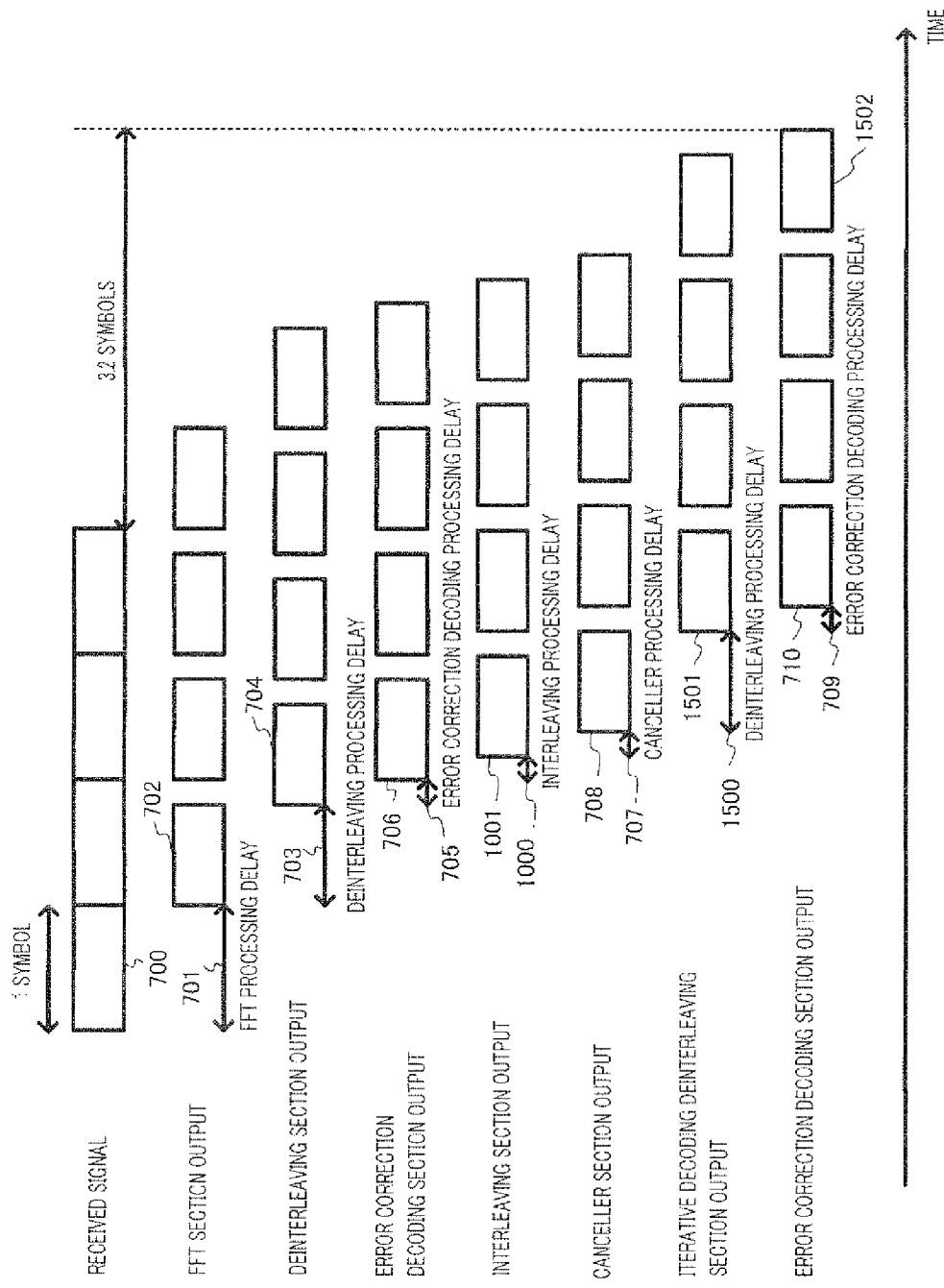
FIG. 26 illustrates processing delay times according to Embodiment 3.

Next, the main processing delay times of demodulation section 230B shown in FIG. 20 will be explained with reference to FIG. 26. In the processing delay times in FIG. 26 unlike the case illustrated in FIG. 18, the processing delay in the iterative decoding deinterleaving section are produced. Other processing delay times are the same as shown in FIG. 18. Thus, the processing delay in the iterative decoding deinterleaving section will be explained mainly. According to FIG. 26, the iterative decoding deinterleaving section outputs output data 1501, processing delay time 1500 after having received data as input. This processing delay time 1500 is based on the fact that iterative decoding deinterleaving sections 2378A and 2378B read data only after writing of the third column of subcarriers is finished (see FIG. 24 and FIG. 25). Furthermore according to FIG. 26, the overall processing delay time of demodulation section 230B is until the time at which the output of output data 1502 of the error correction decoding section ends. This overall processing delay time is shorter than the prior art. When data of a certain data unit is rearranged, the conventional interleaving/deinterleaving processing must cumulate all data of each rearrangement unit once for reasons related to the rearrangement rule and then output the data. FIG. 26 shows processing delay times of the present embodiment. The processing delay time required in the interleaving processing of the iterative decoding section can be shortened compared to the conventional method shown in FIG. 1. This is because channel estimation storage circuit 2370 and signal storage circuit 2374 are provided with an address conversion table to rearrange data, making it possible to change the rearrangement rules of the interleaving processing of the re-modulation section and the deinterleaving processing of the re-demodulation section that performs iterative decoding. That is, bit interleaving sections (2360A, 2360B) perform rearrangement processing according to the above rule to shorten processing delays, and can thereby set the rearrangement rule in channel estimation storage circuit 2370, signal storage circuit 2374 and iterative decoding deinterleaving sections (2378A, 2378B) so that the order of sequence 2349 of data inputted in error correction decoding section 2350 matches the order of data sequence 2317 inputted in error correction decoding section 2318. Therefore, the processing delay time required in interleaving processing can be shortened, providing an effect of shortening the processing delay time necessary for the entire reception processing.

Furthermore, since the processing delay in iterative decoding is shortened, when the number of iterations is increased, the effect of shortening the processing delay time improves.

(Embodiment 4)

Figure 27:
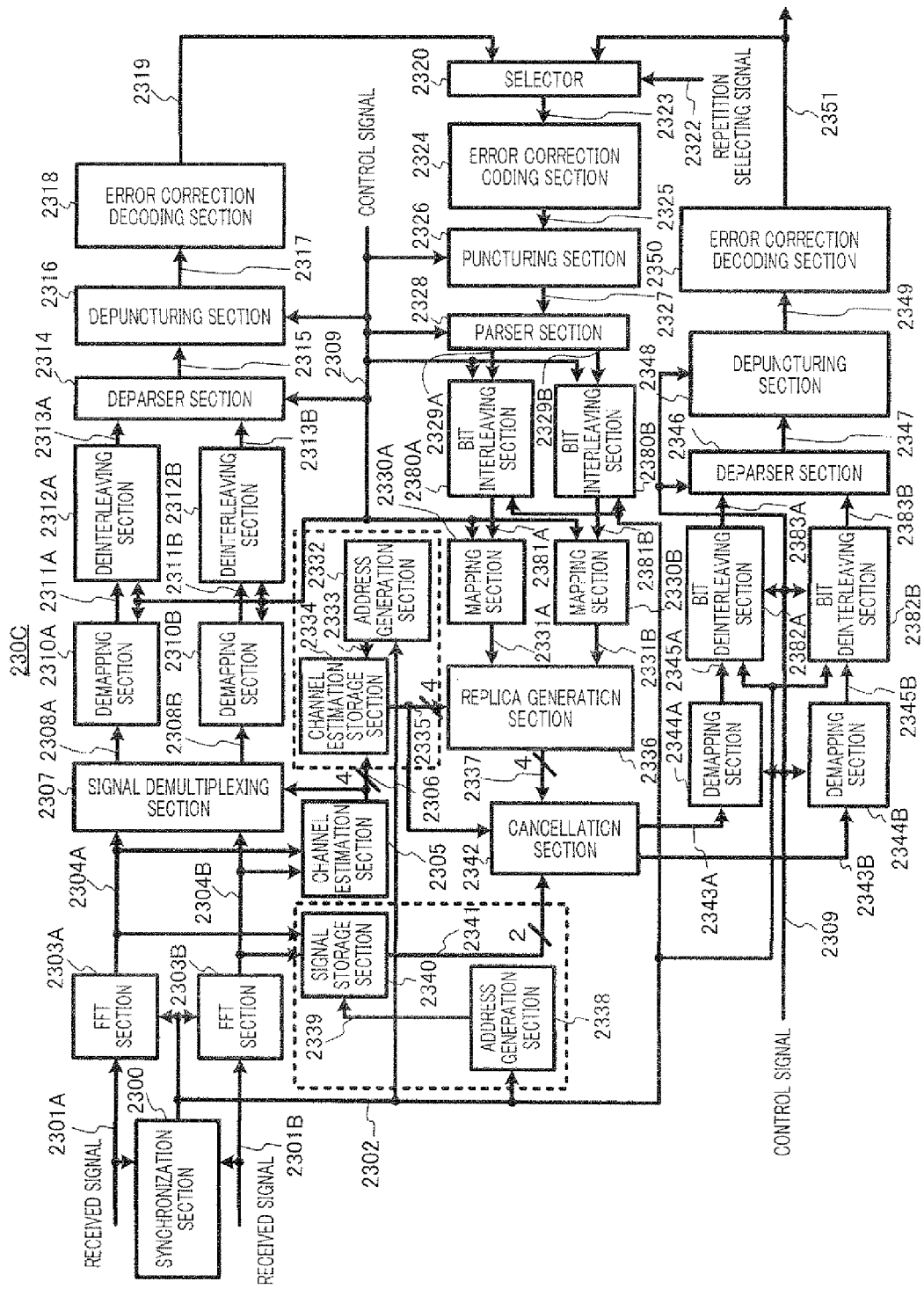
FIG. 27 shows a configuration example of a receiving apparatus according to Embodiment 4 of the present invention.

FIG. 27 shows a configuration example of demodulation section 230C of a receiving apparatus according to Embodiment 4 of the present invention. In Embodiment 4, the same parts as in Embodiment 1 to Embodiment 3 will be assigned the same reference numerals and overlapping explanations will be omitted. Demodulation section 230C in FIG. 27 has bit interleaving sections 2380A and 2380B instead of bit interleaving sections 2360A and 2360B of demodulation section 230A shown in FIG. 15. Furthermore, the present embodiment is different from Embodiment 2 in that demodulation section 230C has bit deinterleaving sections 2382A and 2382B instead of bit deinterleaving sections 2362A and 2362B of demodulation section 230A shown in FIG. 15 and further inputs timing signal 2302 outputted from synchronization section 2300 to bit interleaving sections 2380A and 2380B, and bit deinterleaving sections 2382A and 2382B.

Bit interleaving section 2380A receives as input parsed data sequence 2329A of parser section 2328, control signal 2309 and timing signal 2302. Bit interleaving section 2380A then rearranges the order of input data in response to the input of control signal 2309, and outputs interleaved data 2381A in response to the input of timing signal 2302. Bit interleaving section 2380B can also include the same components as in bit interleaving section 2380A.

Bit deinterleaving section 2382A receives as input likelihood 2345A, control signal 2309 and timing signal 2302. Bit deinterleaving section 2382A rearranges the order of input data in response to the input of control signal 2309, and deinterleaves the rearranged input data in response to the input of timing signal 2302 and outputs the data. Bit deinterleaving section 238213 can also include the same components as in bit deinterleaving section 2382A.

[Configuration of Bit Interleaving Section]

Figure 28:
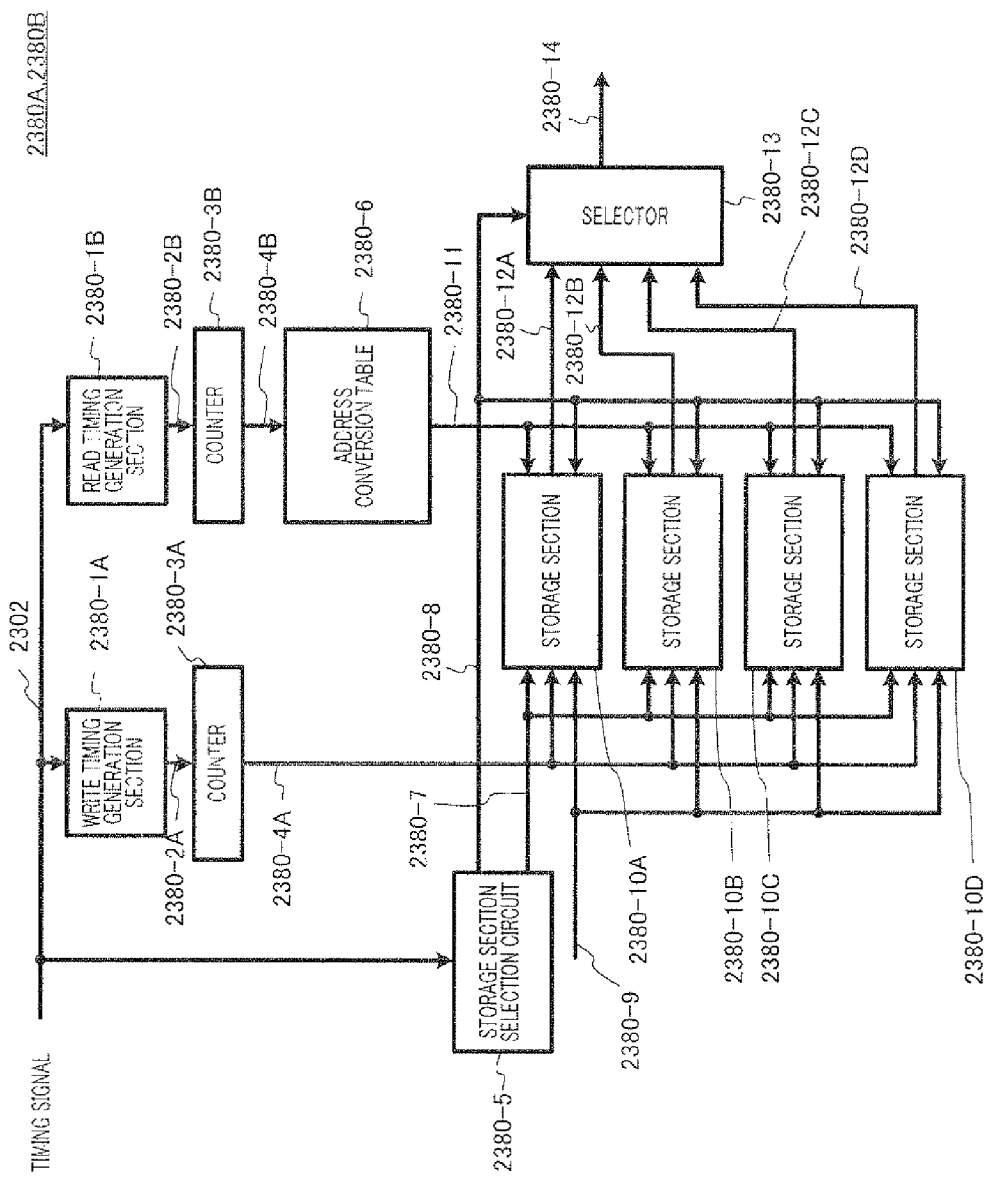
FIG. 28 shows a configuration example of the bit interleaving section according to Embodiment 4.

FIG. 28 shows a configuration example of the bit interleaving section. Interleaving sections 2380A and 2380B each include write timing generation section 2380-1A, each counter 2380-3A, 2380-3B, storage section selection circuit 2380-5 and four storage sections 2380-10A to 2380-10D. Furthermore, bit interleaving sections 2380A and 2380B each include read time generation section 2380-1B, address conversion table 2380-6 and selector 2380-13.

Write timing generation section 2380-1A receives as input timing signal 2302, generates and outputs write counter control signal 2380-2A for controlling counter 2380-3A based on the input of timing signal 2302 in accordance with the time data 2380-9 is inputted in storage sections 2380-10A to 2380-

10D. Counter 2380-3A receives as input write counter control signal 2380-2A and counts up on a counter in response to the input of write counter control signal 2380-2A. Counter 2380-3A then generates and outputs an address indicating the value of the counter counted up, that is, write address 2380-4A of storage sections 2380-10A to 2380-10D.

Storage section selection circuit 2380-5 receives as input timing signal 2302, generates and outputs control signal (i.e. write storage section selection signal) 2380-7 for selecting a target storage section into which data is written in response to the input. Furthermore, storage section selection circuit 2380-5 generates and outputs control signal (i.e. read storage section selection signal) 2380-8 for selecting a target storage section into which data is read in response to the input of timing signal 2302. Write storage section selection signal 2380-7 is designed to switch between storage sections 2380-10A, 2380-10B, 2380-10C and 2380-10D in that order for each 1/4 OFDM symbol to store data 2380-9 therein. Read storage section selection signal 2380-8 is designed to extract data from the respective storage sections in order in which the data are stored.

Read time generation section 2380-1B receives as input timing signal 2302. Read time generation section 2380-1B then generates and outputs read counter control signal 2380-2B for controlling counter 2380-3B from each storage section 2380-10A, 2380-10B, 2380-10C, 2380-10D in synchronization with the time to read data (i.e. the input of timing signal 2302). According to the present embodiment, the time to output read counter control signal 2380-2B from read time generation section 2380-1B is generated by read time generation section 2380-1B after 1/4 OFDM symbol data 2380-9 is received as input after write counter control signal 2380-2A is outputted.

Counter 2380-3B receives as input read counter control signal 2380-2B. Counter 2380-3B then counts up and outputs counter signal 2380-4B for generating addresses for reading data from each storage section 2380-10A, 2380-10B, 2380-10C, 2380-10D according to read counter control signal 2380-2B.

Address conversion table 2380-6 receives counter signal 2380-4B as input, converts the input signal to be counted up to read address signal 2380-11, and outputs read address signal 2380-11. This address conversion table 2380-6 stores a table, for example, as shown in FIG. 11 and performs the above-described conversion using this table.

Storage section 2380-10A receives as input arbitrary data of write address 2380-4A, data 2380-9 and read address signal 2380-11. Storage section 2380-10A writes data 2380-9 into a storage area specified by write address 2380-4A or reads data stored in a storage area specified by read address signal 2380-11. Storage section 2380-10A then outputs read data 2380-12A. Storage sections 2380-10B, 2380-10C and 2380-10D also include the same components as storage section 2380-10A and output data 2380-12B, 2380-12C and 2380-12D respectively.

Selector 2380-13 receives as input read storage section selection signal 2380-8 and data 2380-12A, 2380-12B, 2380-12C and 2380-12D, selects data 2380-12A, 2380-12B, 2380-12C or 2380-12D according to read storage section selection signal 2380-8 and outputs data 2380-14.

The inclusion of the above-described components allows the read time to read out data from the storage section by the read time generation section to be controlled without cumulating one OFDM symbol data.

The present embodiment assumes the read time to be after input of 1/4 OFDM symbol, but any read time can be set if it at least falls within a period of time after input of 1/4 OFDM symbol until one OFDM symbol.

Timing signal 2302 outputted from synchronization section 2300 shown in FIG. 27 is received as input to bit interleaving sections 2380A and 2380B of iterative decoding and bit deinterleaving sections 2382A and 2382B. Furthermore, by adopting the configuration of the storage circuit including storage section selection circuit 2380-5 and storage sections 2380-10A, 2380-10B, 2380-10C and 2380-10D shown in FIG. 28, bit interleaving sections 2380A and 2380B can output data after 1/4 OFDM symbol data is received as input instead of the conventional processing whereby output is started after one OFDM symbol data is cumulated.

Furthermore, the inclusion of the above-described components makes it possible to freely design the output timing for interleaving processing and deinterleaving processing at the time of re-modulation or re-demodulation and reduce processing delays.

(Embodiment 5)

Figure 29:
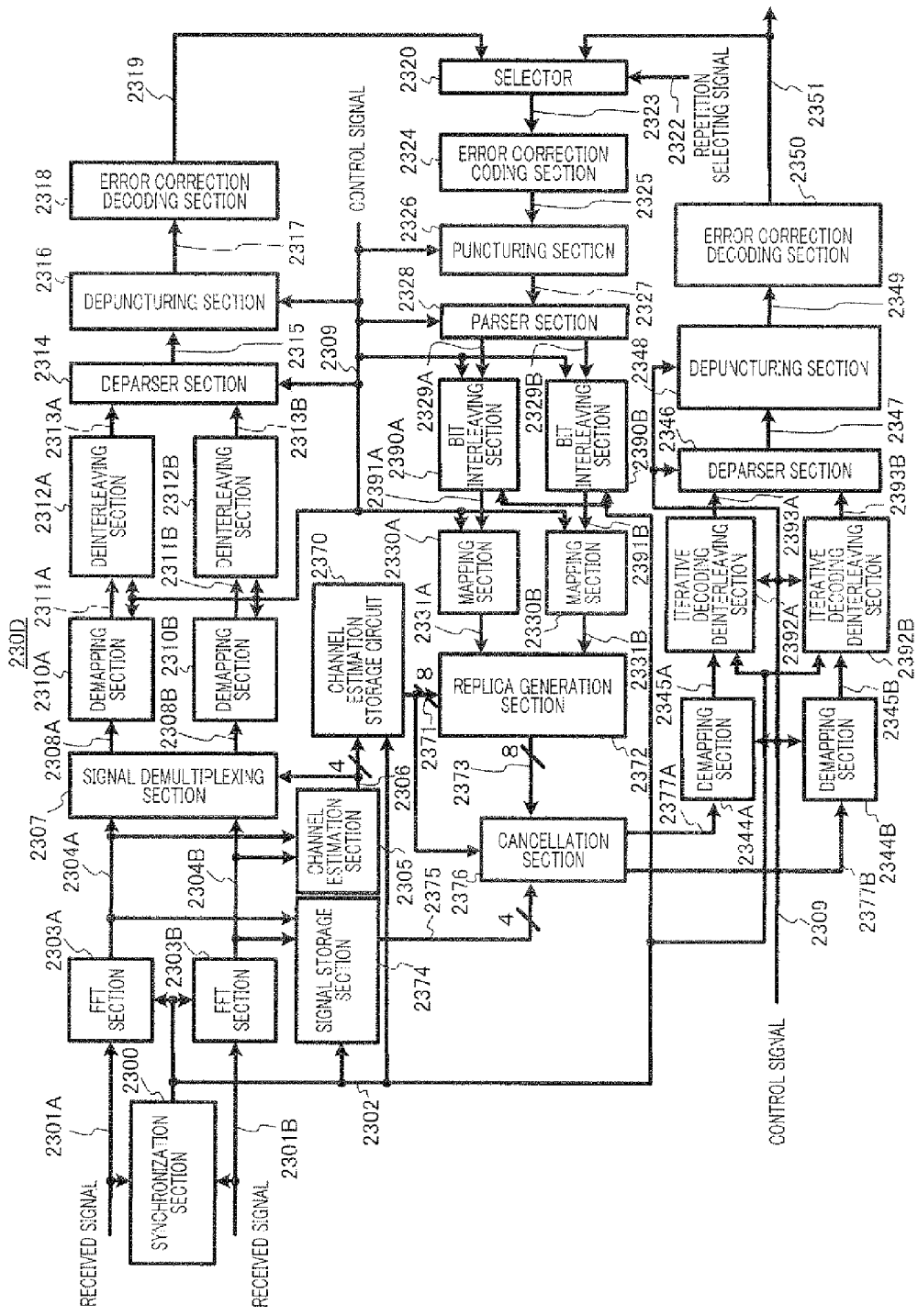
FIG. 29 shows a configuration example of a receiving apparatus according to Embodiment 5 of the present invention.

A receiving apparatus according to Embodiment 5 supports a case where the bit interleaving sections and bit deinterleaving sections of demodulation section 230B in FIG. 20 receive as input timing signal 2302 outputted from synchronization section 2300. The receiving apparatus according to Embodiment 5 supports a case where bit interleaving sections and bit deinterleaving sections of demodulation section 230A in FIG. 15 receive as input timing signal 2302 outputted from synchronization section 2300. FIG. 29 shows a configuration example of demodulation section 230D of the receiving apparatus according to Embodiment 5 of the present invention. In Embodiment 5, the same parts as in Embodiments 1 to 4 will be assigned the same reference numerals and overlapping explanations will be omitted. Demodulation section 230D in FIG. 29 includes bit interleaving sections 2390A and 2390B instead of bit interleaving sections 2360A and 2360B of demodulation section 230B shown in FIG. 20, and demodulation section 230D further includes iterative decoding deinterleaving sections 2392A and 2392B instead of iterative decoding deinterleaving sections 2778A and 2778B of demodulation section 230B shown in FIG. 20. Furthermore, the present embodiment is different from Embodiment 3 in that bit interleaving sections 2390A and 2390B, and iterative decoding deinterleaving sections 2392A and 2392B receive timing signal 2302 outputted from synchronization section 2300.

In FIG. 29, bit interleaving section 2390A receives as input parsed data sequence 2329A of parser section 2328, control signal 2309 and timing signal 2302 outputted from synchronization section 2300. Bit interleaving section 2390A then rearranges the order of input data in response to the input of control signal 2309. Furthermore, bit interleaving section 2390A outputs rearranged and interleaved data sequence 2391A in response to the input of timing signal 2302. Bit interleaving section 2390B can also include the same components as in bit interleaving section 2390A.

Iterative decoding deinterleaving section 2392A in FIG. 29 receives as input likelihood 2345A, control signal 2309 and timing signal 2302. Iterative decoding deinterleaving section 2392A then rearranges the order of input data in response to the input of control signal 2309. Furthermore, iterative decoding deinterleaving section 2392A outputs rearranged and deinterleaved data 2393A in response to the input of timing signal 2302. Iterative decoding deinterleaving section 2392B can also include the same components as in iterative decoding deinterleaving section 2392A.

[Configuration of Bit Interleaving Section]

Bit interleaving sections 2390A and 2390B in FIG. 29 can include the same components as in the storage circuit shown in FIG. 28. That is, each bit interleaving section includes write timing generation section 2380-1A, counters 2380-3A and 2380-3B, storage section selection circuit 2380-5 and four storage sections 2380-10A to 2380-10D. Furthermore, each bit interleaving section further includes read time generation section 2380-1B, address conversion table 2380-6 and selector 2380-13. In this case, data is inputted consecutively in order of, for example, storage section 2380-10A, 2380-10B, 2380-10C and 2380-10D. Using such four storage sections allows writing into storage section 2380-10A to be finished even when data is received as input in a continuous manner, and allows storage section 2380-10A to be read in the middle of writing in storage section 2380-10B. If the four storage sections are realized with one storage section, it is not until writing of all data (corresponding to the four storage sections) is finished that the data can be read. By inputting timing signal 2302 outputted from above-described synchronization section 2300 to bit interleaving sections 2390A and 2390B and including the components of FIG. 28 in bit interleaving sections 2390A and 2390B, input data can be read into storage sections 2380-10A to 2380-10D at arbitrary time for a period of time from 1/4 OFDM symbol to one OFDM symbol.

[Configuration of Iterative Decoding Deinterleaving Section]

In FIG. 29, iterative decoding deinterleaving sections 2392A and 2392B can also include the same components as in the bit interleaving sections. That is, each iterative decoding deinterleaving section includes write timing generation section 2380-1A, counters 2380-3A and 2380-3B, storage section selection circuit 2380-5 and four storage sections 2380-10A to 2380-10D. Furthermore, the iterative decoding deinterleaving section further includes read time generation section 2380-1B, address conversion table 2380-6 and selector 2380-13 of the bit deinterleaving section. The inclusion of the above-described components allows data cumulated in storage sections 2380-10A to 2380-10D to be outputted at arbitrary time from 1/4 OFDM symbol to one OFDM symbol. In the present embodiment, for reasons related to the rearrangement rule in iterative decoding deinterleaving, iterative decoding deinterleaving sections 2392A and 2392B start to read data at the time 3/4 OFDM symbol data is cumulated in storage sections 2380-10A to D.

By inputting timing signal 2302 outputted from synchronization section 2300 shown in FIG. 29 to the bit interleaving sections of the iterative decoding section and the iterative decoding deinterleaving sections and including the components of the storage section shown in FIG. 28, it is possible to output data after 1/4 OFDM symbol or 3/4 OFDM symbol data is cumulated instead of the conventional processing whereby output is started after one OFDM symbol data is cumulated. By the way, the time to generate an output timing signal is not limited to 1/4 OFDM symbol or 3/4 OFDM symbol, but may be changed to an appropriate value. The inclusion of the above-described components makes it possible to freely design the output timing for interleaving processing and deinterleaving processing at the time of re-modulation or re-demodulation, and reduce processing delays.

The disclosure of Japanese Patent Application No. 2007-039391, filed on Feb. 20, 2007, including the specification, drawings and abstract, is incorporated herein by reference in its entirety.

Industrial Applicability

The receiving apparatus and receiving method of the present is invention are useful, for example, for receiving and repeating demodulating spatial-multiplexed signals transmitted from a plurality of transmitting antennas.

The invention claimed is:

1. A receiving apparatus comprising:
    a plurality of receiving antennas;
    a first decoder section that decodes a data sequence received in the receiving antennas, and outputs a first decoded signal;
    a first conversion section that, according to known rearrangement rules, converts an order of writing or reading channel estimation information generated from the data sequence;
    a first storage section into which and from which the channel estimation information is written and read, in the converted order;
    a second conversion section that, according to the known rearrangement rules, converts an order of writing or reading the data sequence;
    a second storage section into which and from which the data sequence is written and read, in the converted order;
    a re-modulation section that, based on the channel estimation information, re-modulates the first decoded signal and generates re-modulated data;
    a cancellation section that extracts the channel estimation information from the first storage section and the data sequence from the second storage section, in the converted order, and generates a signal stream from which an interference signal in the data sequence is canceled, using the channel estimation information, the first decoded signal and the re-modulated data; and
    a second decoder section that, based on the signal stream, performs decoding and outputs a second decoded signal.

2. The receiving apparatus according to claim 1, wherein the known rearrangement rules are defined, in terms of writing, to write the data sequence vertically into the second storage section, and defined, in terms of reading, to read the data sequence horizontally from the second storage section.

3. The receiving apparatus according to claim 1, further comprising:
    a bit interleaver section that performs bit interleaving processing on the first decoded signal; and
    a bit deinterleaver section that performs bit deinterleaving processing on the signal stream, wherein:
    the bit interleaver section and the bit deinterleaver section receive as input a timing control signal; and
    the bit interleaver section reads data before input of data of an interleaving processing unit is finished.

4. The receiving apparatus according to claim 3, wherein:
    the first decoded signal and the data sequence are each formed with a plurality of symbols;
    the bit interleaver section performs bit interleaving processing of the first decoded signal according to known interleaving rules for cumulating part of each symbol of the first decoded signal and performing the interleaving processing; and
    the bit deinterleaver section performs bit deinterleaving processing of the signal stream according to known deinterleaving rules for cumulating part of each symbol of the data sequence and performing the deinterleaving processing.

5. The receiving apparatus according to claim 4, wherein the known rearrangement rules are classified based on different types of the data sequence.

6. The receiving apparatus according to claim 4, further comprising:
    an iterative decoding deinterleaver section that performs rearrangement processing on the signal stream according to known iterative decoding deinterleaving rules for cumulating the signal stream and performing the rearrangement processing, wherein:

the iterative decoding deinterleaver section reads data in accordance with the timing control signal.

7. The receiving apparatus according to claim 1, wherein:

the first conversion section and the second conversion section receive as input a timing signal; and the first storage section and the second storage section perform in writing and reading based on the timing signal.

8. A receiving method comprising the steps of:

receiving a data sequence;

decoding the data sequence and outputting a first decoded signal;

according to known rearrangement rules, converting an order of writing or reading channel estimation information generated from the data sequence;

writing and reading the channel estimation information into and from a first memory section in the converted order;

according to the known rearrangement rules, converting an order of writing or reading the data sequence;

writing and reading the data sequence into and from a second storage section in the converted order;

based on the channel estimation information, re-modulating the first decoded signal and generating re-modulated data;

extracting the channel estimation information from the first storage section and the data sequence from the second storage section, in the converted order, and generating a signal stream from which an interference signal in the data sequence is canceled, using the channel estimation information, the first decoded signal and the re-modulated data; and based on the signal stream, performing decoding and outputting a second decoded signal.

* * * * *